US009215705B2

(12) United States Patent
Seo et al.

(10) Patent No.: US 9,215,705 B2
(45) Date of Patent: Dec. 15, 2015

(54) METHOD AND APPARATUS FOR MONITORING CONTROL CHANNEL IN WIRELESS COMMUNICATION SYSTEM

(75) Inventors: Dongyoun Seo, Anyang-si (KR); Mingyu Kim, Anyang-si (KR); Suckchel Yang, Anyang-si (KR); Joonkui Ahn, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 513 days.

(21) Appl. No.: 13/521,014

(22) PCT Filed: Mar. 30, 2011

(86) PCT No.: PCT/KR2011/002187
§ 371 (c)(1),
(2), (4) Date: Mar. 5, 2013

(87) PCT Pub. No.: WO2011/122852
PCT Pub. Date: Oct. 6, 2011

(65) Prior Publication Data
US 2013/0155868 A1 Jun. 20, 2013

Related U.S. Application Data

(60) Provisional application No. 61/319,235, filed on Mar. 30, 2010.

(51) Int. Cl.
*G01R 31/08* (2006.01)
*H04B 3/46* (2015.01)
(Continued)

(52) U.S. Cl.
CPC ........ *H04W 72/042* (2013.01); *H03M 13/3723* (2013.01); *H03M 13/6525* (2013.01); *H04J 11/0069* (2013.01); *H04W 72/1289* (2013.01)

(58) Field of Classification Search
CPC .................................................. H04W 72/042
USPC .......................................................... 370/241
See application file for complete search history.

(56) References Cited

U.S. PATENT DOCUMENTS 8,201,031 B2 * 6/2012 Cheng ........................... 714/701
2002/0034944 A1 * 3/2002 Tanno et al. ................... 455/434
(Continued)

FOREIGN PATENT DOCUMENTS

KR    10-2009-0033001 A    4/2009

OTHER PUBLICATIONS

CATT. "DL Control Channel Scheme for LTE-A", 3GPP TSG RAN WG1 meeting #55bis, R1-090191, Jan. 12-16, 2009, Ljubljana, Slovenia. 5 pages.
(Continued)

*Primary Examiner* — Gerald Smarth
(74) *Attorney, Agent, or Firm* — Birch, Stewart, Kolasch & Birch, LLP

(57) ABSTRACT

The present disclosure provides a method for monitoring a control channel in a wireless access system, including setting the number of maximum blind decoding times for each user equipment (UE)-specific search space and a common search space to which the control channel is transmitted; monitoring a plurality of candidate control channels in each of the search spaces, based on the number of maximum blind decoding times, set in the respective search spaces; and receiving downlink control information through a control channel which has succeeded in the blinding decoding among the plurality of candidate control channels, wherein the common search space is allocated to at least one carrier group that includes at least one component carrier.

18 Claims, 22 Drawing Sheets

(51) Int. Cl.
*H04W 72/04* (2009.01)
*H03M 13/37* (2006.01)
*H03M 13/00* (2006.01)
*H04J 11/00* (2006.01)
*H04W 72/12* (2009.01)

(56) References Cited

U.S. PATENT DOCUMENTS

| | | | |
|---|---|---|---|
| 2006/0233150 A1 | 10/2006 | Cherian | |
| 2009/0042532 A1* | 2/2009 | Bienas et al. | 455/403 |
| 2009/0088148 A1 | 4/2009 | Chung et al. | |
| 2010/0050059 A1* | 2/2010 | Cheng | 714/786 |
| 2010/0215011 A1* | 8/2010 | Pan et al. | 370/329 |
| 2010/0279628 A1* | 11/2010 | Love et al. | 455/70 |
| 2010/0303011 A1* | 12/2010 | Pan et al. | 370/328 |
| 2012/0163437 A1* | 6/2012 | Frederiksen et al. | 375/224 |

OTHER PUBLICATIONS

Qualcomm Europe. "Clarifications of PDCCH Search Space", 3GPP TSG RAN WG1 #53bis, R1-082543, Jun. 30-Jul. 4, 2008, Warsaw, Poland. pp. 1-5.

* cited by examiner (a)

(b)

$B_{CCS,Max,ref}$: NUMBER OF MAXIMUM BD TIMES IN COMMON SEARCH SPACE $M_{USS,Max,ref}$: NUMBER OF MAXIMUM BD TIMES IN UE-SPECIFIC SEARCH SPACE $Bw_{ref}$: REFERENCE CASE BANDWIDTH Example) $B_{CCS,Max,ref}=12$
$M_{USS,Max,ref}=48$
$B_{wref}=20MHz$ UE CAPA $\begin{cases} BW_{Max} = 20MHz \\ C_{Max} = 2 \end{cases}$ CA $\begin{cases} C_{Max} = 2 \\ C_{Conf} = 2 \end{cases}$ UE CAPA $\begin{cases} BW_{Max} = 20MHz \\ C_{Max} = 2 \end{cases}$ CA $\begin{cases} C_{Max} = 2 \\ C_{Conf} = 2 \end{cases}$ UE CAPA $\begin{cases} BW_{Max} = 20MHz \\ C_{Max} = 2 \end{cases}$ CA $\begin{cases} C_{Max} = 2 \\ C_{Conf} = 1 \end{cases}$

METHOD AND APPARATUS FOR MONITORING CONTROL CHANNEL IN WIRELESS COMMUNICATION SYSTEM

CROSS REFERENCE TO RELATED APPLICATIONS

This application is the National Phase of PCT/KR2011/002187 filed on Mar. 30, 2011, which claims priority under 35 U.S.C. 119(e) to U.S. Provisional Application No. 61/319,235 filed on Mar. 30, 2010, all of which are hereby expressly incorporated by reference into the present application.

TECHNICAL FIELD

The present disclosure relates to wireless communication, and more particularly, to a method and apparatus for monitoring a control channel in a radio communication system supporting a plurality of component carriers.

BACKGROUND ART

3rd generation partnership project (3GPP) long term evolution (hereinafter, referred to as 'LTE') and LTE-advanced (hereinafter, referred to as 'LTE-A') communication systems will be schematically described as examples of mobile communication systems applicable to the present disclosure proposed in the specification.

One or more cells exist in one base station. One cell is set to one of bandwidths of 1.25 MHz, 2.5 MHz, 5 MHz, 10 MHz, 15 MHz and 20 MHz with respect to one carrier so as to provide a downlink/uplink transmission service to several user equipments (UEs). In this case, different cells may be set to provide different bandwidths. One base station controls data transmission/reception for a plurality of UEs. The base station transmits downlink (DL) scheduling information of DL data to a corresponding UE so as to inform the corresponding UE of information related to time/frequency domains to which data is to be transmitted, encoding, data size, hybrid automatic repeat request (HARQ), etc. The base station transmits uplink (UL) scheduling information of UL data to the corresponding UE so as to inform the corresponding UE of information related to time/frequency domains that can be used by the corresponding UE, encoding, data size, HARQ, etc. An interface for transmitting user traffic or control traffic may be used between base stations.

Although radio communication technology has been developed up to LTE based on wideband code division multiple access (WCDMA), the demands and expectations of users and providers continue to increase. Since other radio access technologies have also been continuously developed, new technology evolution is required to secure high competitiveness in the future. The new technology requires decrease in cost per bit, increase in service availability, flexible use of a frequency band, simple structure, open interface, suitable UE power consumption, etc.

Recently, the standardization of the subsequent technology of the LTE is ongoing in the 3GPP. In this specification, the technology is called as 'LTE-A.' The LTE and LTE-A systems are different from each other in terms of system bandwidths and introduction of relays.

The LTE-A system aims to support a wideband of a maximum of 100 MHz. To this end, the LTE-A system uses carrier aggregation or bandwidth aggregation technology which achieves the wideband using a plurality of frequency blocks. The carrier aggregation enables the plurality of frequency blocks to be used as one large logical frequency band in order to use a wider frequency band. The bandwidth of each of the frequency blocks may be defined based on the bandwidth of a system block used in the LTE system. Each of the frequency blocks is transmitted using a component carrier.

As the carrier aggregation technology is used in the LTE-A system that is a next-generation communication system, it is required to develop a method in which a UE receives a signal from a base station or relay in a system supporting a plurality of carriers.

DISCLOSURE OF THE INVENTION

Therefore, an object of the present disclosure is to provide a method of setting the number of maximum blind decoding (BD) times in an LTE-A UE in a search space to which a control channel is transmitted, in consideration of a new downlink control information (DCI) format for uplink multi-input multi-output (UL MIMO) in a carrier aggregation system.

Another object of the present disclosure is to provide a method of distributing (or allocating), for each component carrier (CC), the number of maximum BD times, set in the LTE-A UE.

To achieve these and other advantages and in accordance with the purpose of the present disclosure, as embodied and broadly described herein, there is provided a method for monitoring a control channel in a wireless access system, the method including: setting the number of maximum blind decoding times for each user equipment (UE)-specific search space and a common search space to which the control channel is transmitted; monitoring a plurality of candidate control channels in each of the search spaces, based on the number of maximum blind decoding times, set in the respective search spaces; and receiving downlink control information through a control channel which has succeeded in the blinding decoding among the plurality of candidate control channels, wherein the common search space is allocated to at least one carrier group that includes at least one component carrier.

The monitoring may include performing blind decoding on the plurality of candidate control channels, and the performing of the blind decoding may include performing cyclic redundancy check (CRC) masking on each candidate control channel using a radio network temporary identifier (RNTI).

The number of maximum blind decoding times in the common search space may be set based on the number of the at least one carrier group.

One common search space may be allocated for each carrier group.

The component carrier having the common search space allocated thereto may be a primary component carrier or component carrier on which a physical uplink control channel (PUCCH) is transmitted.

The at least one carrier group may include at least one component carrier having component carriers with the same frequency band, component carriers with different frequency bands, or a heterogeneous duplex structure or heterogeneous downlink-uplink (DL-UL) configuration.

The number of maximum blind decoding times in the UE-specific search space may be set based on the maximum bandwidth in which a UE simultaneously transmits/receives component carriers according to the capability of the UE.

The number of maximum blind decoding times in the UE-specific search space may be set based on the maximum number of component carriers which the UE transmits/receives according to the capability of the UE, the number of component carriers which the UE receives from a base station, or the number of activated component carriers among the received component carriers.

The number of maximum blind decoding times in the UE-specific search space may be allocated for each component carrier, and the number of blind decoding times, allocated for each component carrier, may be determined based on the bandwidth of each component carrier transmitted to the base station or the number of component carriers which the UE receives from the base station.

When the number of maximum blind decoding times in the UE-specific search space is allocated for each component carrier based on the bandwidth of each component carrier, the lower limit of the number of blind decoding times for each component carrier may be determined.

The number of maximum blind decoding times for each component carrier may be determined, and the number of maximum blind decoding times may be set to that in a reference case.

The lower limit may be a value obtained by dividing the maximum number of component carriers which the UE transmits/receives according to the capability of the UE, the number of component carriers which the UE receives from a base station, or the number of activated component carriers among the received component carriers into the number of maximum blind decoding times in the UE-specific search space.

The lower limit may not exceed the number of maximum blind decoding times in the reference case.

The reference case may be set so that the maximum transmit/receive bandwidth of the UE is 20 MHz, a single carrier is supported, and the number of maximum blind decoding times in the UE-specific search space is 48.

The control channel may be a physical downlink control channel (PDCCH).

To achieve these and other advantages and in accordance with the purpose of the present disclosure, as embodied and broadly described herein, there is provided a UE for monitoring a control channel in a wireless access system, the UE including: a radio frequency (RF) unit for communicating a radio signal with an outside of the UE; and a control unit connected to the RF unit, wherein the control unit sets the number of maximum blind decoding times for each UE-specific search space and a common search space to which the control channel is transmitted, monitors a plurality of candidate control channels in each of the search spaces, based on the number of maximum blind decoding times, set in the respective search spaces, and receives downlink control information through a control channel which has succeeded in the blinding decoding among the plurality of candidate control channels, and wherein the common search space is allocated to at least one carrier group that includes at least one component carrier.

The control unit may control the UE so that the number of maximum blind decoding times in the common search space is set based on the number of the at least one carrier group, and one common search space is allocated for each carrier group.

The component carrier having the common search space allocated thereto may be a primary component carrier or component carrier on which a PUCCH is transmitted.

The number of maximum blind decoding times in the UE-specific search space may be set based on the maximum bandwidth in which the UE simultaneously transmits/receives component carriers according to the capability of the UE.

The control unit may control the UE so that the number of maximum blind decoding times in the UE-specific search space is set based on the maximum number of component carriers which the UE transmits/receives according to the capability of the UE, the number of component carriers which the UE receives from a base station, or the number of activated component carriers among the received component carriers.

The control unit may control the UE so that the number of maximum blind decoding times in the UE-specific search space is allocated for each component carrier, and the number of blind decoding times, allocated for each component carrier, may be determined based on the bandwidth of each component carrier transmitted to the base station or the number of component carriers which the UE receives from the base station.

As described above, according to the present disclosure, through the method of setting the number of maximum BD times in a UE in a search space to which a control channel is transmitted and distributing, for each CC, the set number of maximum BD times when a plurality of CCs are aggregated, it is possible to reduce unnecessary production cost of the UE and to effectively use resources configured in the UE.

MODES FOR CARRYING OUT THE PREFERRED EMBODIMENTS

Figure 1:
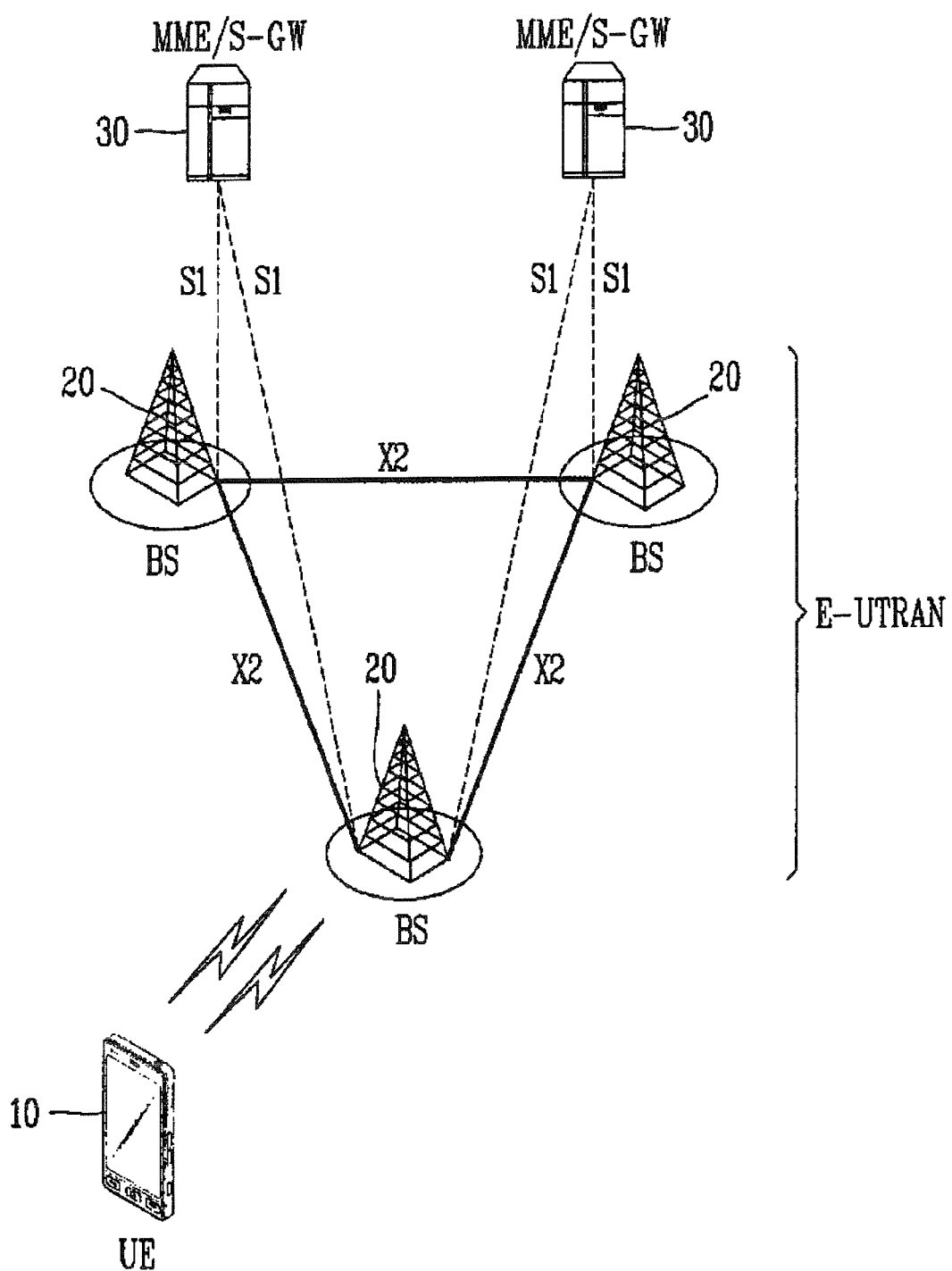
FIG. 1 is a block diagram illustrating a wireless communication system.

Reference will now be made in detail to the preferred embodiments of the present disclosure, examples of which are illustrated in the accompanying drawings. It will also be apparent to those skilled in the art that various modifications and variations can be made in the present disclosure without departing from the spirit or scope of the invention. Thus, it is intended that the present disclosure cover modifications and variations of this invention provided they come within the scope of the appended claims and their equivalents.

For example, although a case in which mobile communication systems of the present disclosure are 3GPP LTE and LTE-A systems will be described in detail, the present disclosure may be applied to other mobile communication systems, except some specific items of the 3GPP LTE and LTE-A systems.

To prevent ambiguity in the concept of the present disclosure, structures and apparatuses of the known art will be omitted, or will be shown in the form of a block diagram based on main functions of each structure and apparatus. Like reference numerals indicate like elements throughout the specification and drawings.

In the following descriptions, it is assumed that the term "terminal" is generally called as a mobile or stationary user device such as a user equipment UE, mobile station (MS) or advanced mobile station (AMS). Also, it is assumed that the term "base station" is generally called as an arbitrary node in a network communicating with the terminal, such as a Node B, eNode B, base station (BS) or access point (AP). The term "relay" may be called as s relay node (RN), a relay station (RS), etc.

In the mobile communication system, the UE or relay may receive information from the BS through a downlink (DL), and may transmit information to the BS through an uplink (UL). Data and various control information are used as the information transmitted or received by the UE or relay, and various physical channels exist according to the kind and usage of the information transmitted or received by the UE or relay.

Description will now be given in detail of a method and apparatus for monitoring a control channel in a wireless communication system, with reference to the accompanying drawings.

FIG. 1 is a block diagram illustrating a wireless communication system.

FIG. 1 may be a network structure of an evolved-universal mobile telecommunication system (E-UMTS). The E-UMTS may also be a long term evolution (LTE) or LTE-advanced (LTE-A) system. The wireless communication system is widely employed to provide various communication services such as voice and packet data services.

Referring to FIG. 1, an evolved-UTMS terrestrial radio access network (E-UTRAN) includes a base station (BS) 20 that provides a control plane and a user plane.

A user equipment (UE) 10 may be fixed or have mobility, and may be referred to as a mobile station (MA), user terminal (UT), subscriber station (SS), wireless device, etc.

The BS 20 generally refers to a fixed station communicating with the UE 10, and may be referred to as an evolved-node B (eNB), base transceiver system (BTS), access point (AP), etc. One or more cells may exist in one BS 20. Interfaces for transmission of user traffic or control traffic may be used between BSs 20.

Hereinafter, downlink refers to a communication channel from the BS 20 to the UE 10, and uplink refers to a communication channel from the UE 10 to the BS 20.

The BSs 20 may be connected to one another through an X2 interface. The BS 20 is connected to an evolved packet core (EPC), more specifically mobility management entity (MME)/serving gateway (S-GW) 30, through an S1 interface. The S1 interface supports a many-to-many relation between the BS 20 and the MME/S-GW 30.

Figure 2:
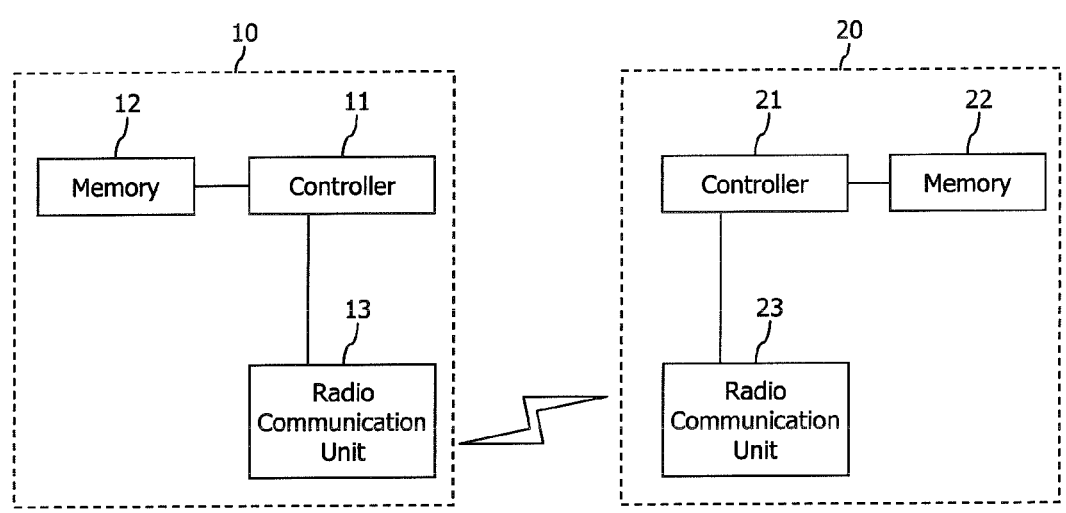
FIG. 2 is a block diagram illustrating a user equipment (UE) and a base station according to an embodiment of the present disclosure.

FIG. 2 is a block diagram illustrating elements of the UE and the BS.

The UE 10 includes a control unit 11, a memory 12 and a radio frequency (RF) unit 13.

The UE 10 also includes a display unit, a user interface unit, etc.

The control unit 11 implements a proposed function, procedure and/or method. Layers of a radio interface protocol may be implemented by the control unit 11.

The memory 12 is connected to the control unit 11 so as to store protocols or parameters for performing radio communication. That is, the memory 12 stores terminal driver systems, applications and general files.

The RF unit 13 is connected to the control unit 11 so as to transmit and/or receive a radio signal.

Additionally, the display unit displays various information of the UE 10, and may use a well-known element such as a liquid crystal display (LCD) or organic light emitting diode (OLED). The user interface unit may be implemented as a combination of well-known user interfaces, such as a keypad or touch screen.

The BS 20 includes a control unit 21, a memory 22 and an RF unit 23.

The control unit 21 implements a proposed function, procedure and/or method. Layers of a radio interface protocol may be implemented by the control unit 21.

The memory 22 is connected to the control unit 21 so as to store protocols or parameters for performing radio communication.

The RF unit 23 is connected to the control unit 21 so as to transmit and/or receive a radio signal.

The control unit 11 or 21 may include an application-specific integrated circuit (ASIC), a chip set, a logical circuit and/or a data processing device. The memory 12 or 22 may include a read-only memory (ROM), a random access memory (RAM), a flash memory, a memory card, a storage medium and/or a storage device. The RF unit 13 or 23 may include a baseband circuit for processing a radio signal. When the embodiment is implemented using software, the aforementioned technique may be implemented using a module (process, function, etc.) performing the aforementioned functions. The module may be stored in the memory 12 or 22, and may be executed by the control unit 11 or 21.

The memory 12 or 22 may exist inside or outside the control unit 11 or 21, and may be connected to the control unit 11 or 21 using various well-known means.

Figure 3:
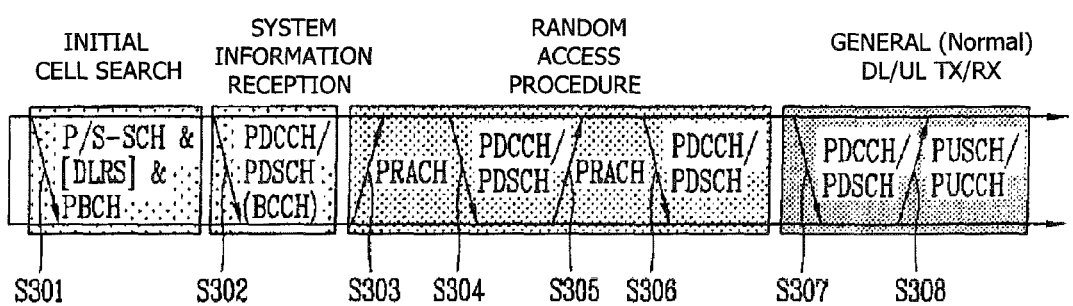
FIG. 3 is a diagram illustrating physical channels used in a 3GPP LTE system and a general signal transmission method using the physical channels.

FIG. 3 is a diagram illustrating physical channels used in a 3GPP LTE system and a general signal transmission method using the physical channels.

A UE performs an initial cell search operation such as synchronization with a BS when the UE is powered on or enters a new cell (S301). To this end, the UE may receive a primary synchronization channel (P-SCH) and a secondary synchronization channel (S-SCH) from the BS so as to be synchronized with the BS, and acquire information such as cell ID. Then, the UE may receive a physical broadcast channel from the BS so as to acquire broadcast information in the cell. In the initial cell search, the UE may receive a downlink reference signal (DL RS) so as to check a DL channel state.

The UE which completes the initial cell search may acquire more detailed system information by receiving a physical downlink control channel (PDCCH) and a physical downlink shared channel (PDSCH) according to information contained in the PDCCH (S302).

Meanwhile, if the UE initially accesses the BS or has no radio resource for signal transmission, the UE may perform a random access procedure for the BS (S303 to S306). To this end, the UE may transmit a specific sequence as a preamble through a physical random access channel (PRACH) (S303 and S305) and receive a response message to the preamble through the PDCCH and corresponding PDSCH (S304 and S306). In the case of competition-based RACH, a contention resolution procedure may be additionally performed.

The UE which has performed the procedure described above may receive a PDCCH/PDSCH (S307) and transmit a physical uplink shared channel (PUSCH)/physical uplink control channel (PUCCH) (S308) as a normal UL/DL signal transmission procedure. The information transmitted from the UE to the BS through an UL or transmitted from the BS to the UE includes a DL/UL acknowledgement (ACK)/non-acknowledgement (NACK) signal, a channel quality indicator (CQI), a precoding matrix index (PMI), a rank indicator (RI), etc.

Figure 4:
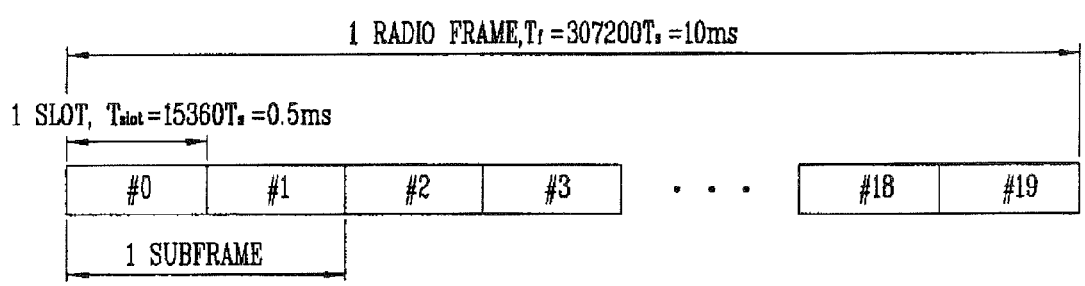
FIG. 4 is a diagram illustrating the structure of a radio frame used in the 3GPP LTE system.

FIG. 4 is a diagram illustrating the structure of a radio frame used in the 3GPP LTE system.

Referring to FIG. 4, one radio frame has a length of 10 ms ($327200T_s$) and consists of ten subframes having an equal size. Each of the subframes has a length of 1 ms and is composed of two slots. Each of the slots has a length of 0.5 ms ($15360T_s$). Here, $T_s$ denotes a sampling time and is represented by $T_s=1/(15 \text{ kHz} \times 2048)=3.1552\times 10^{-8}$ (about 33 ns). The slot includes a plurality of orthogonal frequency division multiplexing (OFDM) or single carrier-frequency division multiple access (SC-FDMA) symbols in the time domain and includes a plurality of resource blocks in the frequency domain.

In the LTE system, one resource block (RB) includes 12 subcarriers×7(6) OFDM or SC-FDMA symbols. A transmission time interval (TTI) that is a unit time for which data is transmitted may be determined in a unit of one or more subframes. The aforementioned structure of the radio frame is merely exemplary, and the number of subframes included in the radio frame, the number of slots included in each of the subframes and the number of OFDM or SC-FDMA symbols included in each of the slots may be variously changed.

Figure 5:
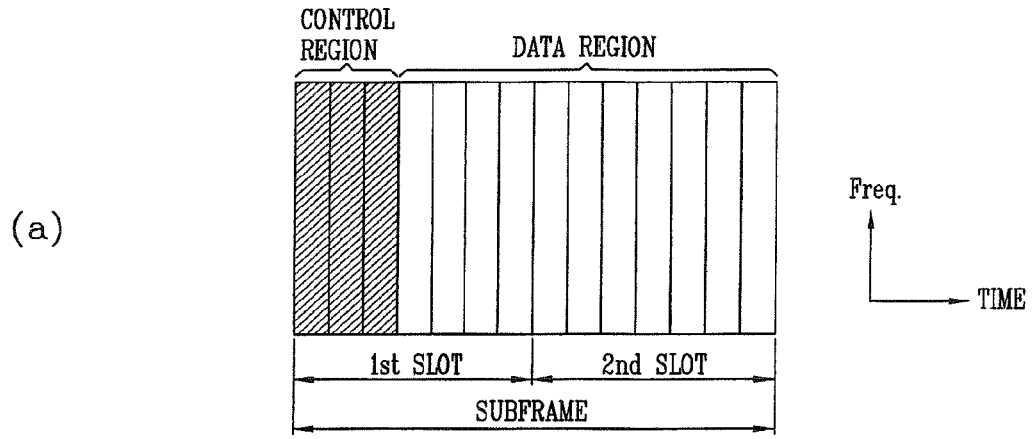
FIG. 5 is a diagram illustrating structures of downlink and uplink subframes used in the 3GPP LTE system.
Figure 5:
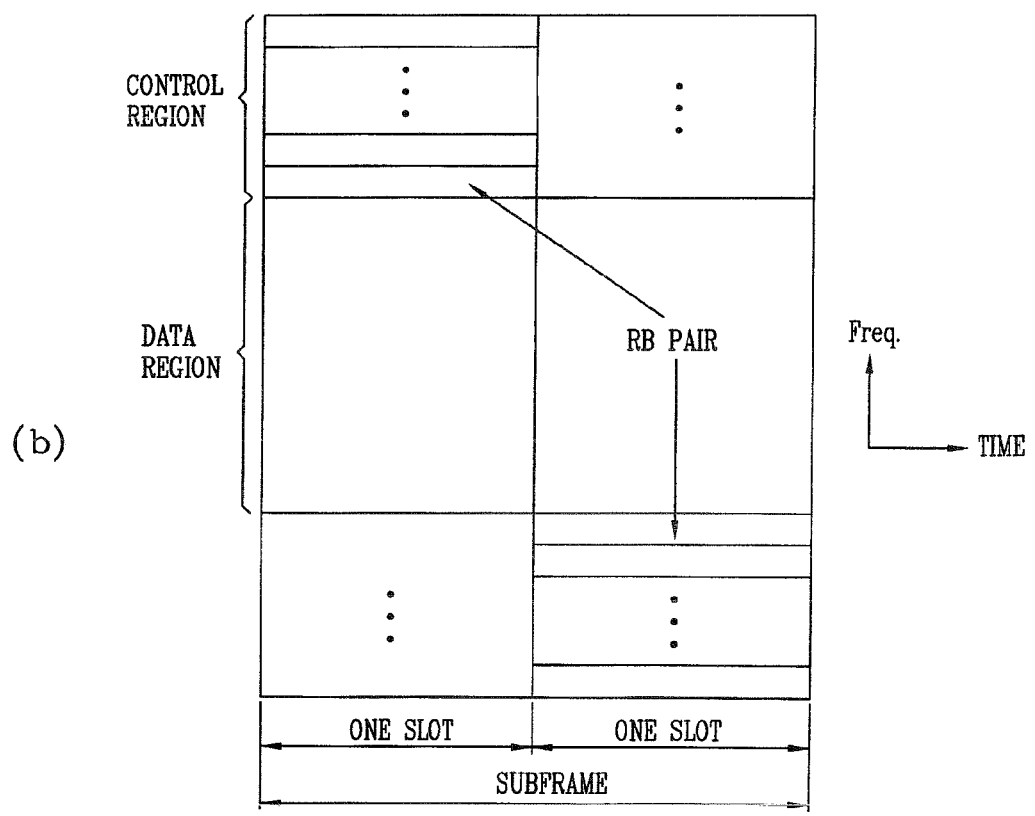

FIG. 5 is a diagram illustrating the structures of DL and UL subframes used in the 3GPP LTE system.

Referring to 5(a), one DL subframe includes two slots in the time domain. A maximum of three OFDM symbols prior to a first slot in the DL subframe become a control region in which control channels are allocated, and the other OFDM symbols become a data region in which PDSCHs are allocated.

The DL control channels used in the 3GPP LTE system, etc. includes a physical control format indicator channel (PCFICH), a physical downlink control channel (PDCCH), a physical hybrid-ARQ indicator channel (PHICH), etc. The PCFICH transmitted in a first OFDM symbol of the subframe carries information on the number of OFDM symbols (i.e., the size of the control region) used in the transmission of control channels in the subframe. The control information transmitted through the PDCCH is referred to as downlink control information (DCI). The DCI indicates UL resource allocation information, DL resource allocation information, UL transmission power control commands for arbitrary UE groups, etc. The PICH carries an ACK/NACK signal for a hybrid automatic repeat request (HARQ). That is, the ACK/NACK signal for UL data transmitted by the UE is transmitted on the PHICH.

Hereinafter, the PDCCH that is a DL physical channel will be described in brief. The PDCCH will be described in detail later with reference to FIGS. 7 to 10.

A BS may transmit, through the PDCCH, resource allocation and transmission format of PDSCH (this is also referred to as DL grant), resource allocation information of PUSCH (this is also referred to as UL grant), an arbitrary UE, a set of power control commands for individual UEs in a group, activation of a voice over Internet protocol (VoIP), etc. A plurality of PDCCHs may be transmitted in the control region, and a UE may monitor the plurality of PDCCHs. The PDCCH is configured as an aggregation of one or some continuous control charge elements (CCEs).

The PDCCH configured as the aggregation of one or some continuous CCEs may be subjected to subblock interleaving and then transmitted through the control region. The CCE is a logical allocation unit used to provide a code rate according to the status of a radio channel to the PDCCH. The CCE corresponds to a plurality of resource element groups. The format of the PDCCH and the number of available bits of the PDCCH are determined according to the correlation between the number of CCEs and the code rate provided by the CCEs.

The control information transmitted through the PDCCH is referred to as DCI. The following Table 1 shows DCI according to DCI formats.

TABLE 1

| DCI Format | Description |
| --- | --- |
| DCI format 0 | used for the scheduling of PUSCH |
| DCI format 1 | used for the scheduling of one PDSCH codeword |
| DCI format 1A | used for the compact scheduling of one PDSCH codeword and random access procedure initiated by a PDCCH order |
| DCI format 1B | used for the compact scheduling of one PDSCH codeword with precoding information |
| DCI format 1C | used for very compact scheduling of one PDSCH codeword |
| DCI format 1D | used for the compact scheduling of one PDSCH codeword with precoding and power offset information |
| DCI format 2 | used for scheduling PDSCH to UEs configured in closed-loop spatial multiplexing mode |
| DCI format 2A | used for scheduling PDSCH to UEs configured in open-loop spatial multiplexing mode |

TABLE 1-continued

| DCI Format | Description |
| --- | --- |
| DCI format 3 | used for the transmission of TPC commands for PUCCH and PUSCH with 2-bit power adjustments |
| DCI format 3A | used for the transmission of TPC commands for PUCCH and PUSCH with single bit power adjustments |

DCI format 0 indicates UL resource allocation information, and DCI formats 1 to 2 indicate DL resource allocation information. DCI formats 3 and 3A indicate UL transmit power control (TPC) commands for arbitrary UE groups.

A scheme of mapping resources for a BS to transmit PDCCH in the LTE system will be described in brief.

In general, a BS may transmit scheduling allocation information and other control information through PDCCH. A physical control channel may be transmitted to one aggregation or a plurality of continuous CCEs. One CCE includes 9 resource element groups (REGs). The number of REGs unallocated to a physical control format indicator channel (PCFICH) or physical hybrid automatic repeat request indicator channel (PHICH) is $N_{REG}$. The CCE that can be used in the system is 0 to $N_{CCE}-1$ (here, $N_{CCE}=\lfloor N_{REG}/9 \rfloor$). The PDCCH supports multiple formats as shown in the following Table 2. One PDCCH configured with n continuous CCEs starts from CCE performing i mode n=0 (here, i is a CCE number). The multiple PDCCHs may be transmitted in one subframe.

TABLE 2

| PDCCH format | Number of CCEs | Number of resource element groups | Number of PDCCH bits |
| --- | --- | --- | --- |
| 0 | 1 | 9 | 72 |
| 1 | 2 | 18 | 144 |
| 2 | 3 | 36 | 288 |
| 3 | 4 | 72 | 576 |

Referring to Table 2, a BS may determine a PDCCH format according to how many regions the BS is to transmit control information, etc. A UE may reduce overhead by reading control information, etc. in the unit of CCE. Similarly, a relay may also read control information, etc. in the unit of R-CCE. In the LTE-A system, resource elements (REs) may be mapped in the unit of relay-control channel element (R-CCE) so as to transmit R-PDCCH for an arbitrary relay.

Referring to FIG. 5(b), the UL subframe may be divided into a control region and a data region in the frequency domain. The control region is allocated to PUCCH carrying UL control information. The data region is allocated to PUSCH carrying user data. To maintain properties of a single carrier, one UE does not transmit the PUCCH and PUSCH at the same time. The PUCCH for one UE is allocated to an RB pair in one subframe. RBs belonging to the RB pair occupy different subcarriers in two slots, respectively.

The RB pair allocated to the PUCCH is frequency-hopped at a slot boundary.

Figure 6:
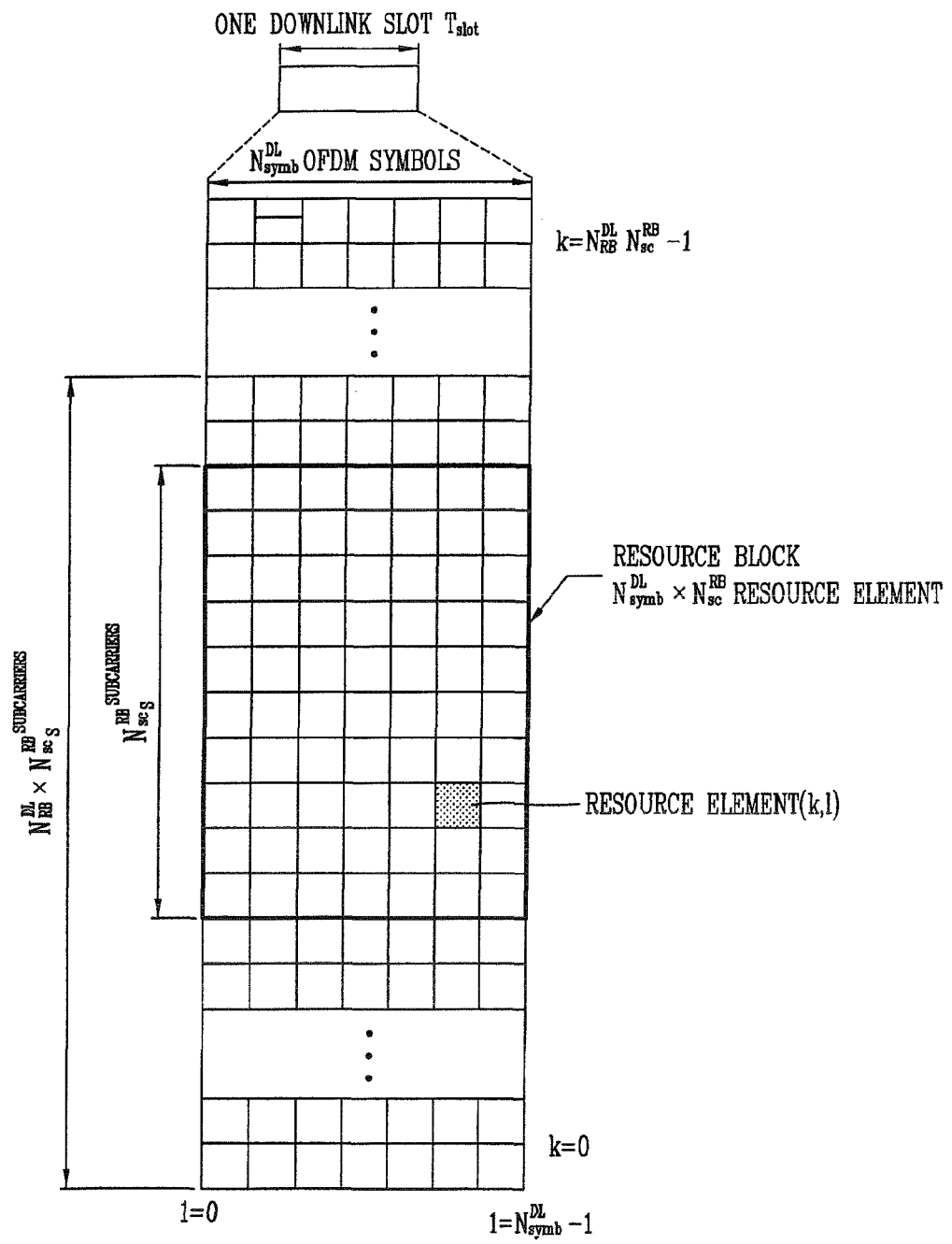
FIG. 6 is a diagram illustrating a time-frequency resource grid structure of a downlink used in the 3GPP LTE system.

FIG. 6 is a diagram illustrating a time-frequency resource grid structure of a downlink used in the 3GPP LTE system.

A DL signal transmitted in each of the slots uses a resource grid structure configured with $N_{RB}^{DL} \times N_{SC}^{RB}$ subcarriers and $N_{symb}^{DL}$ OFDM symbols. Here, $N_{RB}^{DL}$ denotes the number of RBs in a DL, $N_{SC}^{RB}$ denotes the number of subcarriers constituting one RB, and $N_{symb}^{DL}$ denotes the number of OFDM symbols in one DL slot. The size of $N_{RB}^{DL}$ is changed depending on the transmission bandwidth of the DL configured in a cell, and must satisfy $N_{RB}^{min,DL} \leq N_{RB}^{DL} \leq N_{RB}^{max,DL}$. Here, $N_{RB}^{min,DL}$ denotes the smallest DL bandwidth supported in the radio communication system, and $N_{RB}^{max,DL}$ denotes the greatest DL bandwidth supported in the radio communication system. Although $N_{RB}^{min,DL}=6$ and $N_{RB}^{max,DL}=110$, the present disclosure is not limited thereto. The number of OFDM symbols included in one slot may be changed depending on the length of a cyclic prefix (CP) and the interval between subcarriers. In the case of multi-antenna transmission, one resource grid may be defined per antenna port.

Each element in the resource grid for each antenna port is called as a resource element (RE), and is uniquely identified by an index pair (k, l). Here, k denotes an index in the frequency domain, and l denotes an index in the time domain. The k has the value of any one of 0, . . . , $N_{RB}^{DL}N_{SC}^{RB}-1$, and the l has the value of any one of 0, . . . , $N_{symb}^{DL}-1$.

The resource block shown in FIG. 6 is used to describe the mapping relationship between a physical channel and REs. The RB may be divided into a physical resource block (PRB) and a virtual resource block (VRB). One PRB is defined by continuous $N_{symb}^{DL}$ OFDM symbols in the time domain and $N_{SC}^{RB}$ continuous subcarriers in the frequency domain. Here, the $N_{symb}^{DL}$ and $N_{SC}^{RB}$ may be predetermined values. For example, the $N_{RB}^{DL}$ and may be given as shown in the following Table 3. Therefore, the one PRB is configured with $N_{symb}^{DL} \times N_{SC}^{RB}$ REs. Although the one PRB may be correspond to one slot in the time domain and correspond to 180 kHz in the frequency domain, the present disclosure is not limited thereto.

TABLE 3

| Configuration | | $N_{SC}^{RB}$ | $N_{symb}^{DL}$ |
| --- | --- | --- | --- |
| Normal cyclic prefix | Δf = 15 kHz | 12 | 7 |
| Extended cyclic prefix | Δf = 15 kHz | | 6 |
| | Δf = 7.5 kHz | 24 | 3 |

The PRB has a value of 0 to $N_{RB}^{DL}-1$ in the frequency domain. The relationship between a PRB number nPRB in the frequency domain and the REs (k, l) in one slot satisfies $$n_{PRB} = \left\lfloor \frac{k}{N_{SC}^{RB}} \right\rfloor.$$

The size of the VRB is identical to that of the PRB. The VRB may be divided into a localized VRB (LVRB) and a distributed VRB (DVRB). For each type of VRB, a pair of VRBs existing in two slots within one subframe is allocated together with a number $n_{VRB}$.

The VRB and the PRB have the same size. Two types of VRBs are defined: a first type of VRB is the LVRB and a second type of VRB is the DVRB. For each type of VRB, a pair of VRBs has a single VRB index (hereinafter, referred to as a VBR number), and is allocated through two slots within one subframe. In other words, any one of 0 to $N_{RB}^{DL}-1$ indices is allocated to each of the $N_{RB}^{DL}$ VRBs belonging to a first slot of the two slots constituting the one subframe, and any one of 0 to indices is also allocated to each of the $N_{RB}^{DL}$ VRBs belonging to a second slot of the two slots.

As described above, the structure of the radio frame, the DL and UL subframes, the time-frequency resource grid structure of the DL, etc., which are described in FIGS. 4 to 6, may also be applied between the BS and the relay.

Hereinafter, a procedure in which the BS perform downlink transmission of PDCCH to the UE in the LTE system.

Figure 7:
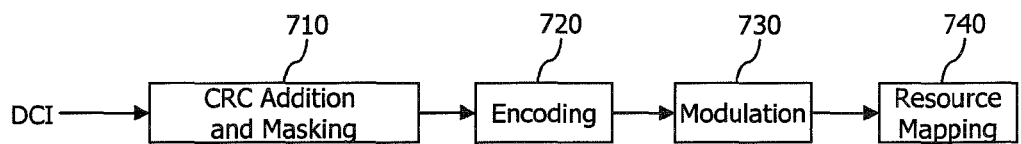
FIG. 7 is a block diagram illustrating the configuration of a physical downlink control channel (PDCCH)

FIG. 7 is a block diagram illustrating the configuration of PDCCH.

After the BS determines a PDCCH format according to the DCI to be downlink transmitted to the UE, the BS adds a cyclic redundancy check (CRC) to the DCI, and masks a unique identifier (this is referred to as a radio network temporary identifier (RNTI)) to the CRC according to the owner or usage of the PDCCH (710).

If the PDCCH is a PDCCH for a specific UE, a unique identifier of the UE, e.g., a cell-RNTI (C-RNTI) may be masked to the CRC. Alternatively, if the PDCCH is a PDCCH for a paging message, a paging indicator identifier, e.g., a paging-RNTI (P-RNTI) may be masked to the CRC. If the PDCCH is a PDCCH for system information, a system information identifier, e.g., a system information-RNTI (SI-RNTI) may be masked to the CRC. A random access-RNTI (RA-RNTI) may be masked to the CRC so as to indicate a random access response that is a response to the transmission of an access preamble of the UE. A transmit power control-RNTI (TPC-RNTI) may be masked to the CRC so as to indicate a TPC command to a plurality of UEs.

If the C-RNTI is used, the PDCCH carries control information for a corresponding specific UE (this is referred to as UE-specific control information). If another RNTI is used, the PDCCH carries common control information received to all or a plurality of UEs in the cell.

The CRC generates coded data by encoding the DCI (720). The encoding includes channel encoding and rate matching.

The coded data is modulated to generate modulation symbols (730).

The modulation symbols are mapped to PREs (740). Each of the modulation symbols is mapped to the RE.

Figure 8:
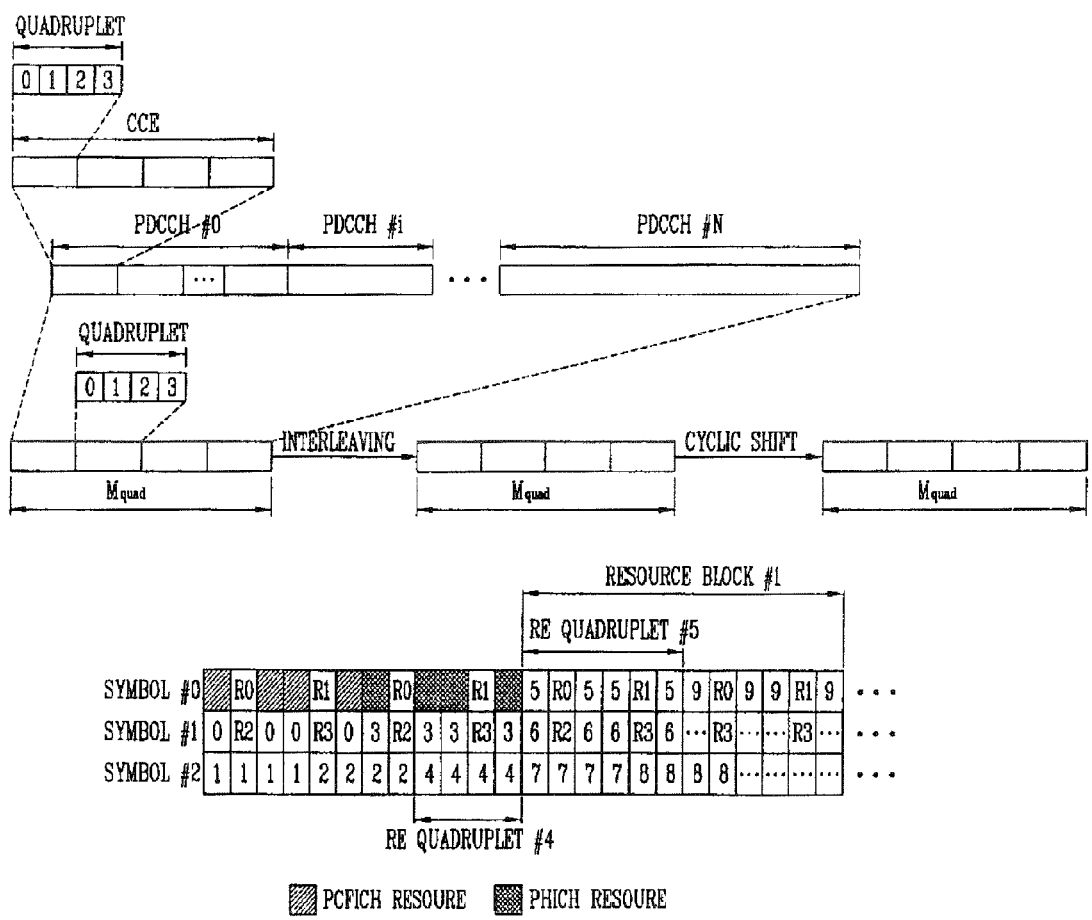
FIG. 8 is a diagram illustrating an example of resource mapping of the PDCCH.

FIG. 8 is a diagram illustrating an example of resource mapping of the PDCCH.

Referring to FIG. 8, R0 denotes a reference signal of a first antenna, R1 denotes a reference signal of a second antenna, R2 denotes a reference signal of a third antenna, and R3 denotes a reference signal of a fourth antenna.

The control region within one subframe includes a plurality of CCEs. The CCE is a logical allocation unit used to provide a code rate according to the status of a radio channel to the PDCCH, and corresponds to a plurality of REGs. The REG includes a plurality of REs. The format of the PDCCH and the number of available bits of the PDCCH are determined according to the correlation between the number of CCEs and the code rate provided by the CCEs.

One REG (designated by a quadruplet in this figure) includes four REs, and one CCE includes nine REGs. To constitute one PDCCH, {1, 2, 4, 8} CCEs may be used, and each of the {1, 2, 4, 8} CCEs is called as a CCE aggregation level.

The control channel configured with one or more CCEs performs interleaving in the unit of REG, and is mapped to a physical resource after the cyclic shift based on a cell ID is performed.

Figure 9:
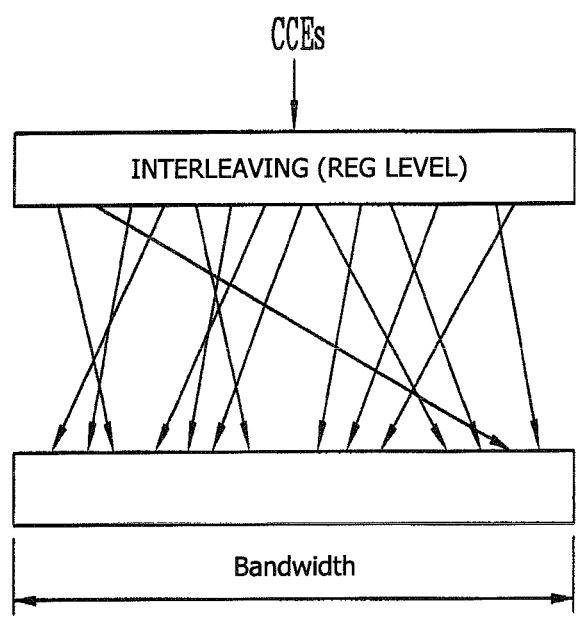
FIG. 9 is a diagram illustrating control channel element (CCE) interleaving in a system band.

FIG. 9 illustrates an example of interleaving CCEs in a system band.

Referring to FIG. 9, a plurality of logically consecutive CCEs are input as an interleaver. The interleaver functions to mix the input CCEs in the unit of REG.

Thus, frequency/time resources constituting one CCE are physically distributed in the entire frequency/time domain within the control region of the subframe. Although the control channel is configured in the unit of CCE, the interleaving is performed in the unit of REG, so that it is possible to maximize frequency diversity and interference randomization.

Figure 10:
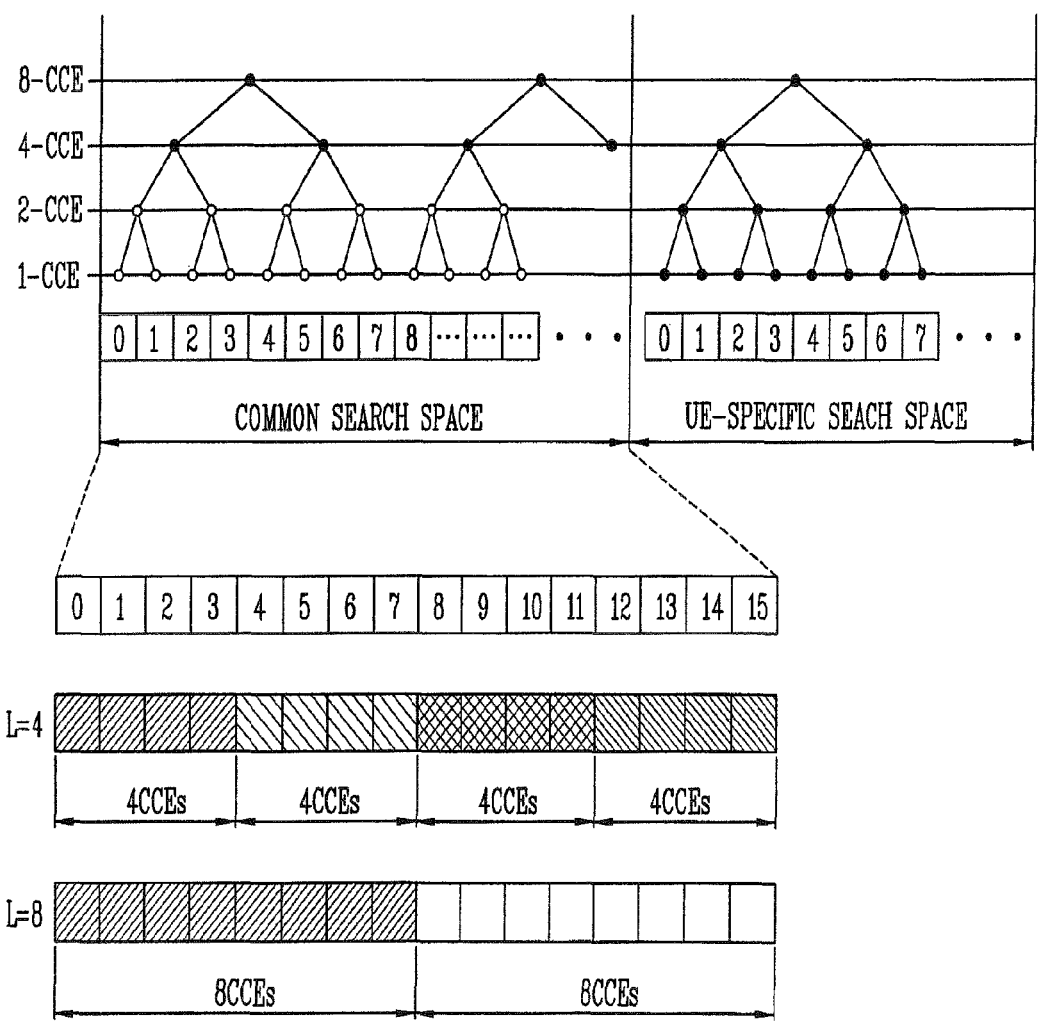
FIG. 10 is an exemplary diagram illustrating monitoring of the PDCCH.

FIG. 10 is an exemplary diagram illustrating monitoring of the PDCCH.

Blind decoding for PDCCH detection is used in the 3GPP LTE system. The blind decoding is a scheme of demasking a desired identifier to the CRC of a received PDCCH (this is referred to as a PDCCH candidate) and identifying whether or not the corresponding PDCCH is its own control channel by checking a CRC error. The UE does not recognize at which position in the control region its own PDCCH is transmitted and with which CCE aggregation level or DCI format its own PDCCH is transmitted.

A plurality of PDCCHs may be transmitted within one subframe. The UE monitors a plurality of PDCCHs at every subframe. Here, the monitoring refers to decoding of the PDCCH tried according to the format of the PDCCH monitored by the UE.

In the 3GPP LTE system, a search space is used to reduce the load caused by the blind decoding. The search space may be called as a monitoring set of CCEs for PDCCHs. The UE monitors PDCCHs in the corresponding search space.

The search space is divided into a common search space and a UE-specific search space. The common search space is a space for searching for PDCCHs having common control information. The common search space consists of 16 CCEs having CCE indices of 0 to 15, and support PDCCHs having CCE aggregation levels of {4, 8}. However, PDCCHs (DCI formats 0 and 1A) carrying UE-specific information may also be transmitted in the common search space. The UE-specific search space supports PDCCHs having CCE aggregation levels of {1, 2, 4, 8}.

The following Table 4 shows the number of PDCCH candidates monitored by the UE.

TABLE 4

| Search Space Type | Aggregation Level L | Size (in CCEs) | Number of PDCCH candidates | DCI formats |
|---|---|---|---|---|
| UE-specific | 1 | 6 | 6 | 0, 1, 1A, 1B, |
| | 2 | 12 | 6 | 1D, 2, 2A |
| | 4 | 8 | 2 | |
| | 8 | 16 | 2 | |
| Common | 4 | 16 | 4 | 0, 1A, 1C, 3/3A |
| | 8 | 16 | 2 | |

The size of the search space is determined by Table 4, and starts points of the common search space and the UE-specific search space are defined different from each other in the search space. The start point of the common search space may be changed for each subframe depending on a UE identifier (e.g., C-RNTI), a CCE aggregation level and/or a slot number in the radio frame. When the start point of the UE-specific search space exists within the common search space, the UE-specific search space and the common search space may be overlapped with each other.

A search space $S^{(L)}_k$ at the aggregation level $L \in \{1, 2, 3, 4\}$ is defined as a set of PDCCH candidates. The CCE corresponding to a PDCCH candidate m of the search space $S^{(L)}_k$ is given as follows.

$$L \cdot \{(Y_k + m) \bmod \lfloor N_{CCE,k}/L \rfloor\} + i \qquad \text{Expression 1}$$

Here, i=0, 1, ..., L−1 and m=0, ..., $M^{(L)}$−1, $N_{CCE,k}$ denote the total number of CCEs that can be used in the transmission of PDCCH in a control region of a subframe k. The control region includes an aggregation of CCEs numbered by 0 to $N_{CCE,k}$−1. $M^{(L)}$ denotes the number of PDCCH candidates at the CCE aggregation level L in a given search space. In the common search space, $Y_k$ is set to 0 with respect to two aggregation levels i.e., L=4 and L=8. In the UE-specific search space, $Y_k$ is defined as follows.

$$Y_k = (A \cdot Y_{k-1}) \bmod D \qquad \text{Expression 2}$$

Here, $Y_{-1} = n_{RNTI} \neq 0$, A=39827, D=65537, k=floor($n_s/2$), and $n_s$ denotes a slot number in the radio frame.

When the UE monitors PDCCHs using the C-RNTI, the DCI format and search space to be monitored are determined according to the transmission mode of PDSCH.

The following Table 5 shows an example of PDCCH monitoring in which C-RNTI is set.

gation, and the case in which the number of DL CCs is different from that of UL CCs is referred to as asymmetric aggregation.

The CC may also be called as a 'cell.'

The 'cell' means combination of DL resources and selective UL resources. The linking between carrier frequencies of the DL and UL resources may be identified through system information transmitted to the DL resources.

The 'cell' may mean a pair of DL and UL CCs or may mean only the DL CC. Here, UL CC refers to a CC linked with the DL CC.

TABLE 5

| Transmission Mode | DCI Format | Search Space | Transmission Mode of PDSCH according to PDCCH |
|---|---|---|---|
| Mode 1 | DCI format 1A | Common & UE-specific | Single antenna part, Port 0 |
|  | DCI format 1 | UE-specific | Single antenna part, port 0 |
| Mode 2 | DCI format 1A | Common & UE-specific | Transmit diversity |
|  | DCI format 1 | UE-specific | Transmit diversity |
| Mode 3 | DCI format 1A | Common & UE-specific | Transmit diversity |
|  | DCI format 2A | UE-specific | Cyclic delay diversity (CDD) or transmit diversity |
| Mode 4 | DCI format 1A | Common & UE-specific | Transmit diversity |
|  | DCI format 2 | UE-specific | Closed-loop spatial multiplexing |
| Mode 5 | DCI format 1A | Common & UE-specific | Transmit diversity |
|  | DCI format 1D | UE-specific | Multi-user multiple input multiple output (MU-MIMO) |
| Mode 6 | DCI format 1A | Common & UE-specific | Transmit diversity |
|  | DCI format 1B | UE-specific | Closed-loop spatial multiplexing |
| Mode 7 | DCI format 1A | Common & UE-specific | If number of PBCH transmit ports is 1, single antenna port, and otherwise, transmit diversity |
|  | DCI format 1 | UE-specific | Single antenna part, Port 5 |
| Mode 8 | DCI format 1A | Common & UE-specific | If number of PBCH transmit ports is 1, single antenna port, and otherwise, transmit diversity |
|  | DCI format 2B | UE-specific | Dual layer transmission (port 7 or 8), or single antenna port, port 7 or 8 |

Hereinafter, a multiple carrier system will be described.

Although the 3GPP LTE system supports a case in which the bandwidths of DL and UL are set different from each other, this sets forth one component carrier (CC).

This means that only the case in which the bandwidths of the DL and UL are identical to or different from each other is supported under the situation in which one CC is defined with respect to each of the DL and UL. For example, the 3GPP LTE system supports a maximum of 20 MHz. Although the bandwidths of the DL and UL are different from each other, the 3GPP LTE system supports one CC with respect to each of the DL and UL.

Spectrum aggregation (bandwidth aggregation or carrier aggregation) is to support a plurality of CCs. The spectrum aggregation is introduced to support an increased throughput, to prevent an increase in cost due to the introduction of a RF element and to ensure compatibility with existing systems. For example, if five CCs are allocated as the granularity of a carrier unit having a bandwidth of 20 MHz, the 3GPP LTE system can support a maximum bandwidth of 100 MHz.

The spectrum aggregation may be divided into contiguous spectrum aggregation performed between continuous carriers in the frequency domain and non-contiguous spectrum aggregation performed between discrete carriers. The number of CCs aggregated between the DL and UL may be set different from each other. The case in which the number of DL CCs is identical to that of UL CCs is referred to as symmetric aggre- That is, the 'cell' may be used as a concept of a pair of DL CC and UL CC or may be used as a term meaning the DL CC.

Here, the 'cell' used herein must be distinguished from a 'cell' as a region covered by a generally used BS. Hereinafter, the 'cell' and the CC may be used together. In this case, the 'cell' means the CC described above.

The sizes (i.e., bandwidths) of the CCs may be different from each other. For example, when five CCs are used for the configuration of a cell having a band of 70 MHz, the cell may be configured as 5 MHz carrier (CC #0)+20 MHz carrier (CC #1)+20 MHz carrier (CC #2)+20 MHz carrier (CC #3)+5 MHz carrier (CC #4).

Figure 11:
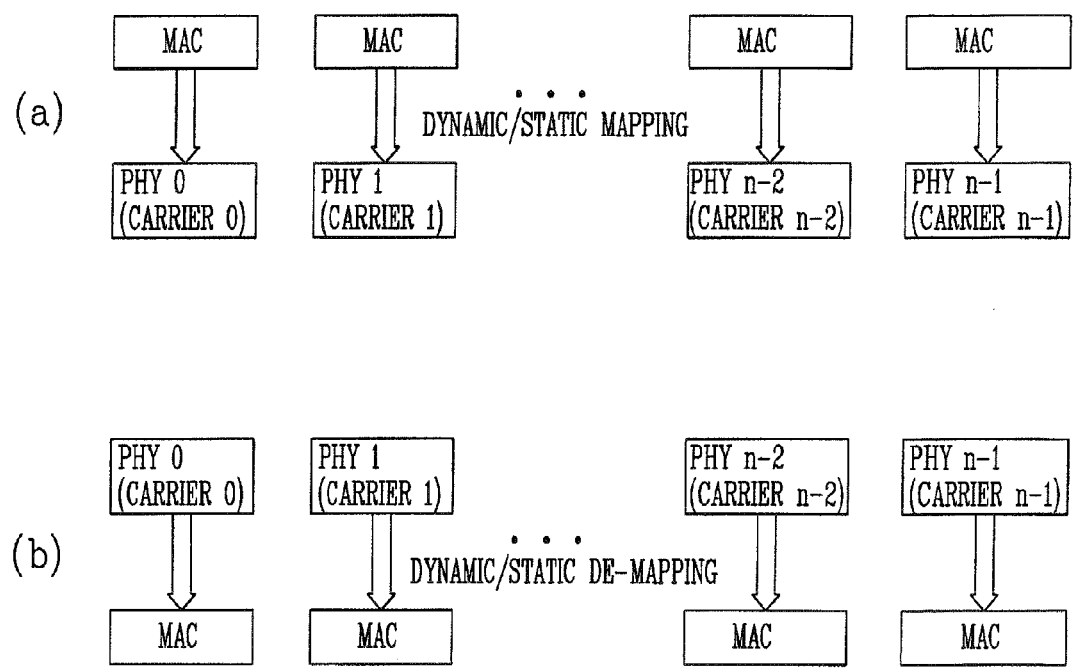
FIG. 11(a) is a diagram illustrating a concept in which a plurality of media access controls (MACs) manage multiple carriers in a base station.
FIG. 11(b) is a diagram illustrating a concept in which a plurality of MACs manage multiple carriers in a UE.
Figure 12:
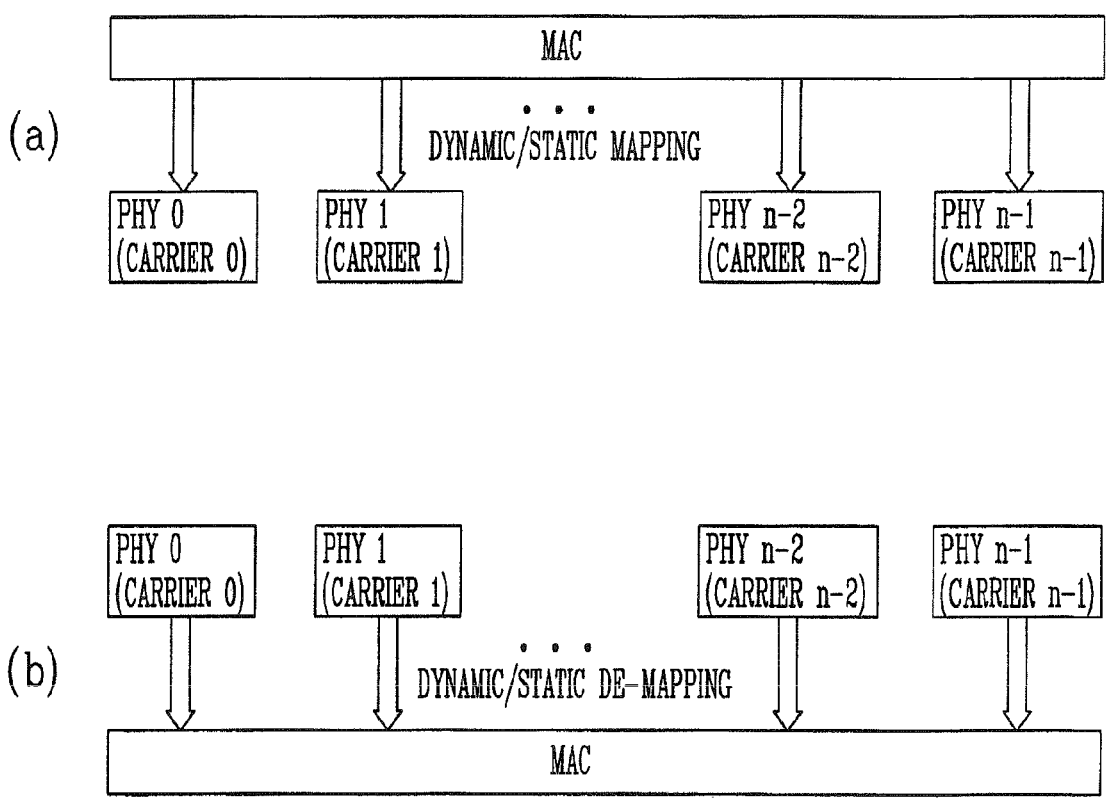
FIG. 12(a) is a diagram illustrating a concept in which one MAC manages multiple carriers in a base station.
FIG. 12(b) is a diagram illustrating a concept in which one MAC manages multiple carriers in the UE.

The configuration of a physical layer (PHY) and a layer 2 (MAC) for transmission in a plurality of UL or DL carrier bands allocated to an arbitrary cell or UE may be shown in FIGS. 11 and 12.

FIG. 11(a) is a diagram illustrating a concept in which a plurality of media access controls (MACs) manage multiple carriers in a base station, and FIG. 11(b) is a diagram illustrating a concept in which a plurality of MACs manage multiple carriers in a UE.

As shown in FIGS. 11(a) and (b), MACs may control the carriers one by one, respectively. In a system supporting a plurality of carriers, each of the carriers may be used contiguous or non-contiguous. The carrier may be applied regardless of the UL/DL. A time division duplex (TDD) system is configured to operate N carriers including DL transmission and UL transmission within each of the carriers, and a frequency division duplex (FDD) is configured to use a plurality of carriers in each of the UL and DL. The FDD system may support asymmetric carrier combination in which the numbers and/or bandwidths of carriers combined in the UL and DL may support are different.

FIG. 12(a) is a diagram illustrating a concept in which one MAC manages multiple carriers in a BS, and FIG. 12(b) is a diagram illustrating a concept in which one MAC manages multiple carriers in the UE.

Referring to FIGS. 12(a) and (b), one MAC performs transmission/reception by managing and operating one or more frequency carriers. Since it is unnecessary that the frequency carriers managed in the one MAC are contiguous to each other, it is further flexible in terms of the management of resources. In FIGS. 12(a) and (b), one PHY means one component carrier for convenience of illustration. Here, the one PHY does not necessarily means an independent RF device. Although the independent RF device generally means one PHY, the present disclosure is not limited thereto, and one RF device may include several PHYs.

A series of PDCCHs transmitting control information of L1/L2 control signaling, generated from a packet scheduler of the MAC layer for supporting the configuration in the FIGS. 12(a) and (b), may be transmitted by being mapped to physical resources in an individual component carrier.

Particularly, the PDCCH for channel allocation related to unique PDSCH or PUSCH transmission of an individual UE or control information related to grant may be generated as PDCCH encoded for each component carrier transmitted through a corresponding physical sharing channel. The generated PDCCH is called as a separate coded PDCCH. In another manner, control information for physical sharing channel transmission of several carrier components may be configured as one PDCCH to be transmitted. The PDCCH is called as a joint coded PDCCH.

To support the DL or UL carrier combination, the BS may configure connection so that the PDCCH and/or PDSCH for performing control information and data transmission suitable for a unique situation fore each specific UE or relay is transmitted, or may allocate component carriers that become targets of measurement and/or reporting as a preliminary procedure of performing connection configuration for the transmission of the PDCCH and/or PDSCH. The allocation is called as component carrier allocation according to an arbitrary purpose.

In case where component carrier allocation information is controlled in L3 radio resource management (RRM), the BS may transmit the PDCCHs through unique RRC signaling (UE-specific or relay-specific RRC signaling) of a series of UEs or relays according to control dynamic characteristics, or may transmit the PDCCHs through L1/L2 signals or a series of dedicated physical channels for the transmission of only the control information.

Figure 13:
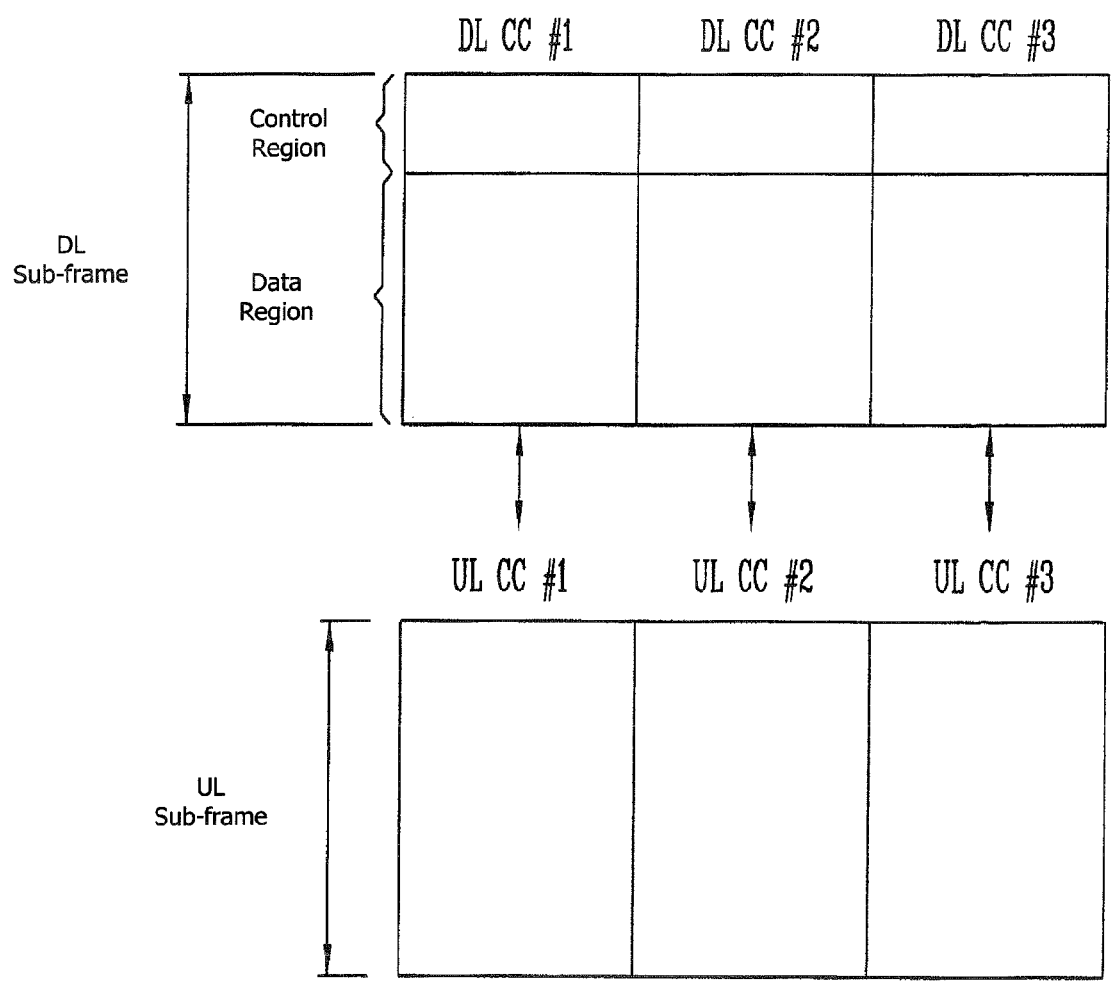
FIG. 13 is a diagram illustrating an example of multiple carriers.

FIG. 13 is a diagram illustrating an example of the multiple carriers.

Although the number of each of the DL CCs and UL CCs is three, the present disclosure is not limited to the number of DL CCs and UL CCs. PDCCH and PDSCH are independently transmitted in each of the DL CCs, and PUCCH and PUSCH are independently transmitted in each of the DL CCs.

Hereinafter, the multiple carrier system, as described above, refers to a system that supports multiple carriers based on the spectrum aggregation.

The contiguous spectrum aggregation and/or non-contiguous spectrum aggregation may be used in the multiple carrier system, and any one of the symmetric aggregation and asymmetric aggregation may be used in the multiple carrier system.

In the multiple carrier system, the linkage between the DL CC and UL CC may be defined. The linkage may be configured through EARFCN information contained in DL system information. The linkage is configured using a fixed DL/UL Tx/Rx separation relationship. The linkage refers to a mapping relationship between the DL CC through which PDCCH carrying UL grant is transmitted and the UL CC using the UL grant.

Alternatively, the linkage may be a mapping relationship between the DL CC (or UL CC) through which data for HARQ is transmitted and the UL CC (or DL CC) through which HARQ ACK/NACK signal is transmitted. The BS may transmit linkage information to the UE as a high-level layer message such as an RRC message or a portion of system information. The linkage between the DL CC and UL CC may be fixed, but may be changed into the linkage between cells/UEs.

The separate-coded PDCCH means that one PDCCH can carry control information such as resource allocation for PDSCH/PUSCH with respect to one carrier. That is, the PDCCH and PDSCH correspond to each other, and the PDCCH and PUSCH corresponds to each other.

The joint-coded PDCCH means that one PDCCH that can carry control information such as resource allocation for PDSCH/PUSCH of a plurality of CCs. The one PDCCH may be transmitted through one CC or may be transmitted through a plurality of CCs.

Hereinafter, although an example of division coding based on PDSCH-PDSCH that is a DL channel for convenience of illustration, this may also be applied to the relationship between PDCCH and PUSCH.

In the multiple carrier system, the CC scheduling may be implemented using two methods.

In a first method, a PDCCH-PDSCH pair is transmitted through one CC. The CC is referred to as a self-scheduling CC. The self-scheduling CC means that the UL CC through which the PUSCH is transmitted becomes a CC linked to the DL CC through which the corresponding PDCCH is transmitted.

That is, the PDCCH allocates PDSCH resources on the same CC or allocates PUSCH resources on the linked UL CC.

In a second method, the DL CC through which the PDSCH is transmitted or UL CC through which the PUSCH is transmitted is determined regardless of the DL CC through which the PDCCH is transmitted. That is, The PDCCH and PDSCH are transmitted through different DL CCs from each other, or the PUSCH is transmitted through the UL CC not linked with the DL CC through which the PDCCH is transmitted. This is referred to as cross-carrier scheduling.

The CC through which the PDCCH is transmitted may be called as a PDCCH carrier, monitoring carrier or scheduling carrier. The CC through which the PDSCH/PUSCH is transmitted may be called as a PDSCH/PUSCH carrier or scheduled carrier.

The cross-carrier scheduling may be activated/non-activated for each UE, and the UE activated by the cross-carrier scheduling may receive DCI containing CIF. The UE can recognize on which scheduled CC the PDCCH received from the CIF contained in the DCI is control information.

The DL-UL linkage predetermined by the cross-carrier scheduling may be overridden. That is, the cross-carrier scheduling is not performed on the linked CC but performed on another CC, regardless of the DL-UL linkage.

Figure 14:
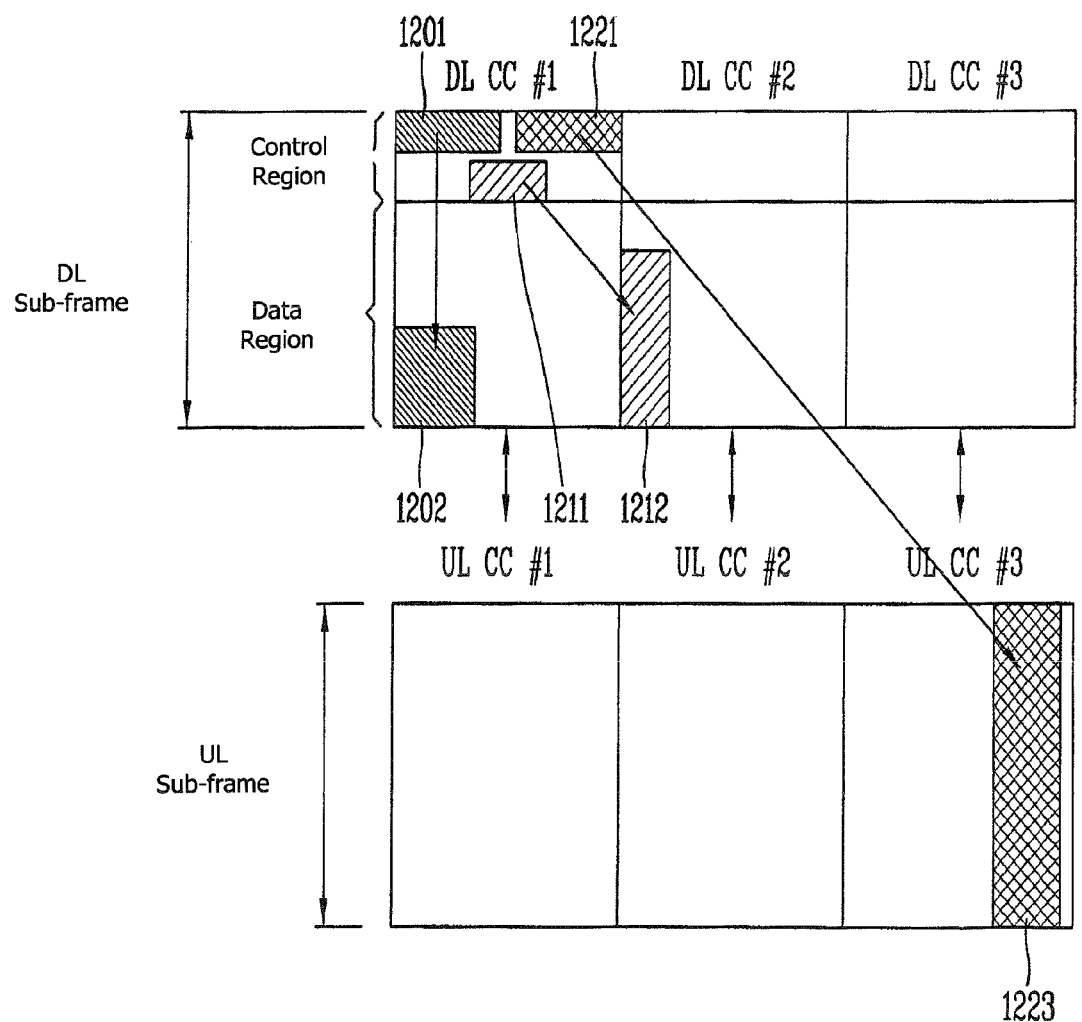
FIG. 14 is a diagram illustrating an example of cross-carrier scheduling.

FIG. 14 is a diagram illustrating an example of the cross-carrier scheduling.

It is assumed that DL CC #1 and UL CC #1 are linked with each other, DL CC #2 and UL CC #2 are linked with each other, and DL CC #3 and UL CC #3 are linked with each other.

A first PDCCH 1401 of the DL CC #1 carries DCI for a PDSCH 1402 of the same DL CC #1. A second PDCCH 1411 of the DL CC #1 carries DCI for a PDSCH 1412 of the DL CC #2. A third PDCCH 1421 of the DL CC #1 carries DCI for a PUSCH 1422 of the UL CC #3 not linked with the DL CC #1.

To perform the cross-carrier scheduling, the DCI of the PDCCH may include a carrier indicator field (CIF). The CIF indicates the DL CC or UL CC scheduled through the DCI. For example, the second PDCCH 1411 may include a CIF indicating the DL CC #2. The third PDCCH 1421 may include a CIF indicating the UL CC #3.

Alternatively, the CIF of the third PDCCH 1421 does not indicate the value of the CIF corresponding to the UL CC but may indicate the value of the CIF corresponding to the DL CC.

That is, the CIF of the third PDCCH 1421 indicates the DL CC #3 linked with the UL CC #3, so as to indirectly indicate the UL CC #3 scheduled by the PUSCH. If the DCI of the PDCCH includes PUSCH scheduling and CIF indicates the DL CC, the UE can determine that the PUSCH scheduling is PUSCH scheduling on the UL CC linked with the DL CC. Accordingly, it is possible to indicate a larger number of CCs as compared with the method of indicating all DL/UL CCs using a CIF having a limited bit length (e.g., CIF having a length of 3 bits).

The UE using the cross-carrier scheduling necessarily monitors PDCCHs of a plurality of scheduled CCs with respect to the same DCI format in the control region of one scheduled CC. For example, if the transmission modes of the plurality of DL CCs are different from one another, the UE may monitor a plurality of PDCCHs with respect to different DCI format in each of the DL CCs. If the bandwidths of the DL CCs are different from one another even though the same transmission mode is used, the sizes of payloads the same DCI format are different from one another, and therefore, the UE may monitor a plurality of PDCCHs.

Consequently, when the cross-carrier scheduling is possible, the UE necessarily monitor PDCCHs for a plurality of DCI in the control region of a monitoring CC according to the transmission mode and/or bandwidth for each CC. Thus, to support this, there is required the configuration of a search space and PDCCH monitoring.

First, in the multiple carrier system, the following terms are defined.

UE DL CC set: a set of DL CCs scheduled for the UE to receive PDSCH.

UE UL CC set: a set of UL CCs scheduled for the UE to transmit PUSCH.

PDCCH monitoring set refers to at least one set of DL CCs, which performs PDCCH monitoring. The PDCCH monitoring set may be the same as the UE DL CC set or may be a subset of the UE DL CC set. The PDCCH monitoring set may include at least one of DL CCs within the UE DL CC set. Alternatively, the PDCCH monitoring set may be separately defined regardless of the UE DL CC set. The UL CCs included in the PDCCH monitoring set may be set so that the self-scheduling for linked UL CCs is always possible.

The UE DL CC set, the UE UL CC set and the PDCCH monitoring set may be configured as cell-specific or UE-specific sets.

Also, it is as follows, which DCI format the CIF is included.

If the CRC is scrambled by P-RNTI, RA-RNTI or TC-RNTI, the DCI format does not include the CIF.

If the CRC is scrambled (or masked) by P-RNTI, RA-RNTI or TC-RNTI, DCI formats 0, 1, 1A, 1B, 1D, 2, 2A and 2B which can be received in the UE-specific search information may include the CIF.

Figure 15:
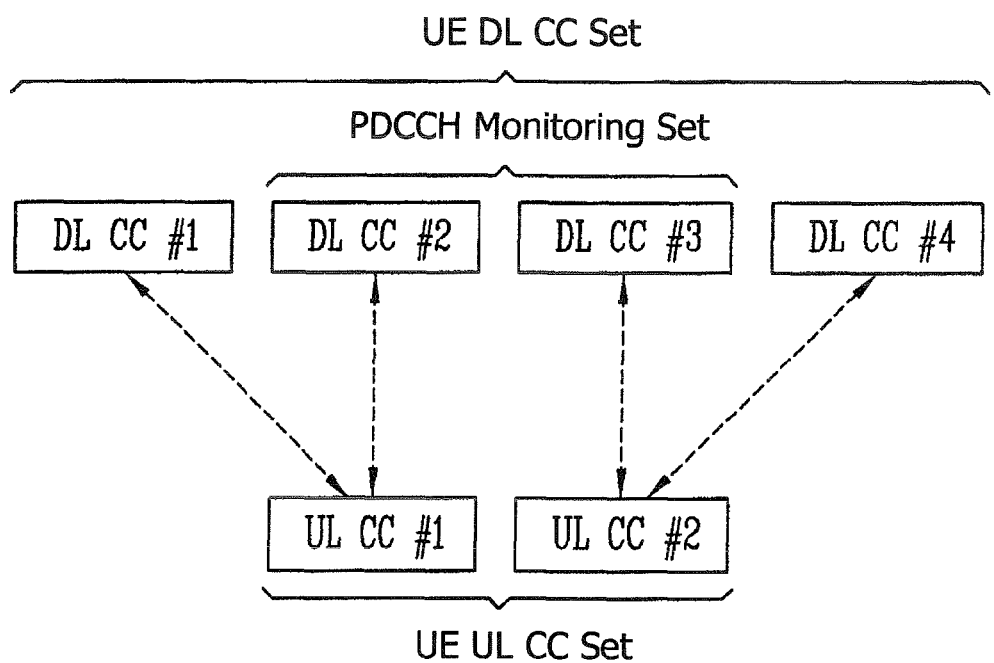
FIG. 15 is a diagram illustrating an example of a component carrier (CC) set.

FIG. 15 illustrates an example of the CC set. It is assumed that four CL CCs (DL CC #1, #2, #3 and #4) as the UE DL CC set, two UL CCs (UL CC #1 and #2) as the UE UL CC set, and two DL CCs (DL CC #2 and #3) as the PDCCH monitoring set are allocated to the UE.

The DL CC #2 in the PDCCH monitoring set transmits PDCCH for PDSCH of the DL CC #1/#2 in the UE UL CC set. The DL CC #3 in the PDCCH monitoring set transmits PDCCH for PDSCH of the DL CC #3 1/#4 in the UE DL CC set and PDCCH for PUSCH of the UL CC #2 in the UE UL CC set.

The linkage between CCs included in the UE DL CC set, the UE UL CC set and the PDCCH monitoring set may be configured. In the example of FIG. 15, the PDCCH-PDSCH linkage is configured between the DL CC #2 that is a scheduling CC and the DL CC #1 that is a scheduled CC, and the PDCCH-PUSCH linkage is configured between the DL CC #2 and the UL CC #1 is configured. The PDCCH-PDSCH linkage is configured between the DL CC #3 that is a scheduling CC and the DL CC #4 that is a scheduled CC, and the PDCCH-PUSCH linkage is configured between the DL CC #3 and the UL CC #2. The BS may inform the UE of information on the scheduling CC or information on the PDCCH-PDSCH/PUSCH linkage through cell-specific signaling or UE-specific signaling.

Alternatively, both the DL CC and UL CC may not be linked with each other with respect to each of the DL CCs in the PDCCH monitoring set. After the DL CC in the PDCCH monitoring set and the DL CC in the UE DL CC set are linked with each other, the UL CC for PUSCH transmission may be limited to the UL CC linked with the DL CC in the UE DL CC set.

CIFs may be set different from one another according to the linkage of the UE DL CC set, the UE UL CC set and the PDCCH monitoring set.

Hereinafter, a method of allocating the number of maximum blind decoding numbers in the common search space and the UE-specific search space and the number of blind decoding numbers for each component carrier in a carrier aggregation system proposed in this specification will be described.

Here, it may be considered that the PDCCH search space for each CC exists in each CC or exists in scheduling CC (i.e., CC on which scheduling PDCCH is transmitted). For example, in the case of each self-scheduling of USS, a search space may exist in each CC on which PDSCH/PUSCH is transmitted. In the case of cross-carrier scheduling, all search spaces may exist in the scheduling CC. Meanwhile, in the case of CCS, the CC in which the search space exists may be changed depending on a scheduling scheme or may exist in each CC regardless of the scheduling scheme. The reason why the search space is positioned in each CC regardless of the scheduling scheme is that in the case of CCS, there is no corresponding CIF. It may also be considered that the CSS exists in only a search space for a specific CC (e.g., PCC).

First, abbreviations used in the description of the method proposed in this specification will be described in brief.

$B_{CSS,Max,ref}$: Number of maximum blind decoding (BD) times in common search space (CSS)

$B_{USS,Max,ref}$: Number of maximum BD times in UE-specific search space (USS)

$B_{USS,MaxUL/DL,ref}$: Number of maximum BD times except number of BD times with respect to UL MIMO format $B_{USS,MaxULMIMO,ref}$: Number of maximum BD times with respect to UL MIMO format in USS $BW_{ref}$: Bandwidth of reference case (e.g., 20 MHz)

The abbreviations are used in the reference case which will be described below.

$B_{CSS,Max,total}$: Number of maximum BD times in CSS
$B_{USS,Max,total}$: Number of maximum BD times in USS
$C_{Max}$: Maximum number of CCs that can be aggregated to UE
$C_{Max,group}$: Maximum number of CC groups that can be aggregated to UE
$B_{CSS,max,CCi}$: Number of maximum BD times with respect to CCi (i represents a specific CC) in CSS
$B_{USS,Max,CCi}$: Number of maximum BD times with respect to CCi (i represents a specific CC) in USS
$B_{USS/CC,Min}$: Lower limit (minimum value) of maximum BD times with respect to specific CC in USS
$BW_{Max}$: Maximum aggregation bandwidth
$BW_{CCi}$: Bandwidth of CCi (i represents a specific CC)
$C_{Conf}$: Number of CCs configured for UE
$C_{Conf,ULMIMO}$: Number of UL MIMO configured CCs which are configured for UE
$C_{Conf,group}$: Number of CC groups configured for UE
$B_{CSS,Max,total,config}$: Number of maximum BD times in CSS according to the number of CCs configured for UE
$B_{USS,Max,total,config}$: Number of maximum BD times in USS according to the number of CCs configured for UE The $C_{Conf}$ may be may be the number of CCs actually allocated to the UE from the BS or the number of activated CCs among CCs actually allocated to the UE from the BS.

As described above, the LTE UE may be configured so that the number of BD times is a maximum of 12 in the CSS so as to detect the common PDCCH regardless of the width of an actually allocated frequency band, and may be configured so that the number of BD times is a maximum of 32 in the USS so as to detect the UE-specific PDCCH.

On the other hand, in the LTE-A system, it is considered that a new DCI format is added for the purpose of UL MIMO that is a newly added function. Therefore, the number of maximum BD times is defined as (6+6+2+2)×(2+1)=48 with respect to one CC in the USS.

First, a method will be described, in which a reference case in the LTE-A system is defined as an example, the number of maximum BD times and the number of BD times for each CC are allocated using the reference case when a plurality of CCs are used. Here, the defined reference case is merely an example, and may be defined differently depending on the maximum bandwidth in which the UE can perform transmission/reception.

Figure 16:
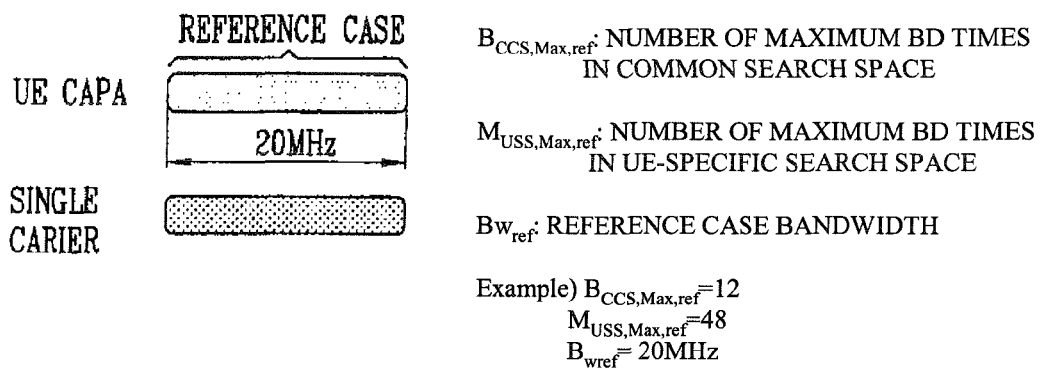
FIG. 16 is a diagram illustrating a reference case according to an embodiment of the present disclosure.

FIG. 16 is a diagram illustrating a reference case according to an embodiment of the present disclosure.

Referring to FIG. 16, the reference case is defined so that the maximum bandwidth in which the LTE-A UE can perform transmission/reception is 20 MHz, and the reference case supports a single carrier.

In the reference case, the number of maximum BD times of the LTE-A UE in CSS is set to 12, and the number of maximum BD times of the LTE-A UE in USS is set to 48 (the new DCI format is added for the purpose of UL MIMO that is a newly added function). That is, in the reference case, $B_{CSS,Max,ref}=12$, $B_{USS,Max,ref}=48$, and $BW_{ref}=20$ MHz.

Hereinafter, the maximum BD capability in each of the CSS and the USS in the system in which CCs are aggregated using the maximum bandwidth and the number of maximum BD times of the defined reference case will be described.

First Embodiment

The first embodiment provides a method of determining the number of maximum BD times in control channel (e.g., PDCCH) search spaces (CSS and USS).

1. In a case where the maximum bandwidth according to the capability of the UE is set in proportion to the number of CCs (1) Method 1

The Method 1 is a method of simply setting the maximum BD capability (or number of times) of each of the UE in the CSS and the USS in proportion to the $C_{Max}$ when the maximum transmit/receive bandwidth $BW_{Max}$ of the UE is set in proportion to the maximum number of CCs $C_{Max}$ on which the UE can perform transmission/reception as compared with the reference case bandwidth $BW_{ref}$.

That is, the number of maximum BD times for each search space according to the Method 1 may be set as follows.

1) The number of maximum blind decoding times in CSS:

$$B_{CSS,Max,total}=B_{CSS,Max,ref}*C_{Max}=B_{CSS,Max,ref}*BW_{Max}/BW_{ref}$$

2) The number of maximum blind decoding times in USS:

$$B_{USS,Max,total}=B_{USS,Max,ref}*C_{Max}=B_{USS,Max,ref}*BW_{Max}/BW_{ref}$$

In a case where the UE can use a plurality of CCs, the number of maximum BD times for each CC is set to be identical to the number of maximum BD times in the reference case.

1) The number of maximum blind decoding times for each CC in CSS:

$$B_{CSS,Max,CCi}=B_{CSS,Max,ref} \text{ for all } i$$

2) The number of maximum blind decoding times for each CC in USS:

$$B_{USS,Max,CCi}=B_{USS,Max,ref} \text{ for all } i$$

Here, the i is a value indicating a specific component carrier.

For example, in a case where the number of CCs on which the UE can perform transmission/reception is 2, the maximum transmit/receive bandwidth $BW_{Max}$ of the UE is set to 40 MHz (20*2). In this case, the number of maximum BD times in the CSS is set to 24, and the number of maximum BD times in the USS is set to 96.

Figure 17:
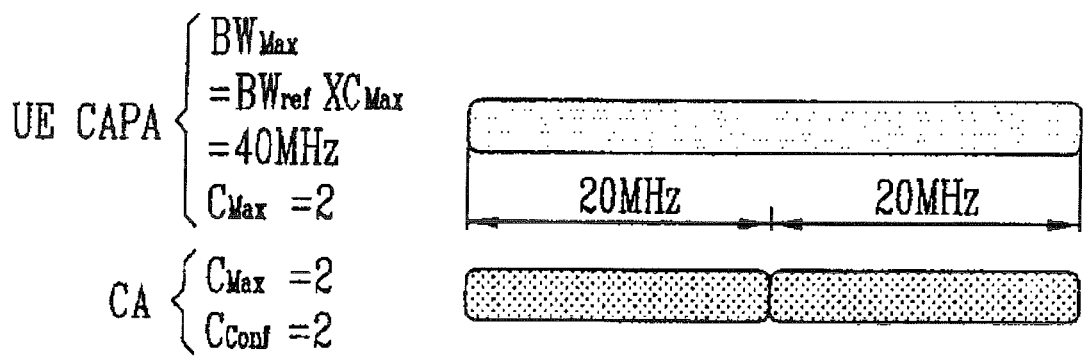
FIG. 17 is a diagram illustrating an example when Method 1 is applied according a first embodiment of the present disclosure.

FIG. 17 is a diagram illustrating an example when the Method 1 is applied according the first embodiment of the present disclosure.

That is, FIG. 17 illustrates a method of setting the number of maximum BD times when the maximum transmit/receive bandwidth of the UE does not increase, and only the maximum number of CCs on which the UE can perform transmission/reception increases.

Referring to FIG. 17, it can be seen that the $BW_{Max}$ ($BW_{max}=40$ MHz) of the UE is set in proportion to the $C_{Max}$ ($C_{max}=2$) of the UE, the maximum number of CCs on which the UE can perform transmission/reception is 2, and the number of actually configured CC is 2.

In the Method 1, the number of maximum BD times for each search space may be set according to the maximum number of CCs on which the UE can perform transmission/reception, but the number of maximum BD times may be set according to the number of CCs actually configured from the BS.

In this case, the number of maximum BD times in the UE according to the number of actually configured CCs (the number of CCs which the UE actually receives from the BS or the number of activated CCs among the received CCs) may be expressed as follows.

1) The number of maximum blind decoding times in CSS:

$B_{CSS,Max,total,config} = B_{CSS,Max,ref} * C_{Conf}$ (i.e., multiple of $C_{Conf,group}$)

2) The number of maximum blind decoding times in USS:

$B_{USS,Max,total,config} = B_{USS,MaxUL/DL,ref} * B_{Conf} + B_{USS,MaxULMIMO,ref} * C_{Conf,ULMIMO}$ (i.e., multiple of $C_{Conf}$)

Meanwhile, it may be considered that only CSS with respect to a specific CC (e.g., PCC) exists, and the number of BD times for CCS is as follows.

$B_{CSS,Max,total} = B_{CSS,Max,total,ref} = B_{CSS,Max,ref}$ (2) Method 2

The Method 2 provides a method of configuring a carrier group including at least one CC and setting the number of maximum BD times for each of the CSS and the USS according to the configured carrier group.

The UE may be aggregated with a carrier group having component carriers with the same frequency band, component carriers with different frequency bands, or a heterogeneous duplex structure or heterogeneous downlink-uplink (DL-UL) configuration.

In this case, it may be considered that carrier groups are configured, and CCs are allocated by limiting the number of CCs on which CSS is transmitted for each carrier group to one. The number of maximum BD times for detecting common PDCCH transmitted to the CSS may be set in proportion to the maximum number of CC groups configured so that a corresponding UE can simultaneously receive CCs. In this case, the CC on which the CSS is transmitted in each CC group may be a CC on which PUCCH is transmitted.

Meanwhile, the capability of the number of maximum BD times for detecting the UE-specific PDCCH transmitted to the USS is set in proportion to the maximum number of CCs which the UE can simultaneously receive. That is, the number of maximum BD times for each search space according to the Method 2 may be set as follows.

1) The number of maximum blind decoding times in CSS:

$B_{CSS,Max,total} = B_{CSS,Max,ref} * C_{Max,group}$ (i.e., multiple of $C_{Max,group}$)

2) The number of maximum blind decoding times in USS:

$B_{USS,Max,total} = B_{USS,MaxUL/DL,ref} * C_{Max} + B_{USS,MaxULMIMO,ref} * C_{Max,ULMIMO}$ (i.e., multiple of $C_{Max}$)

Figure 18:
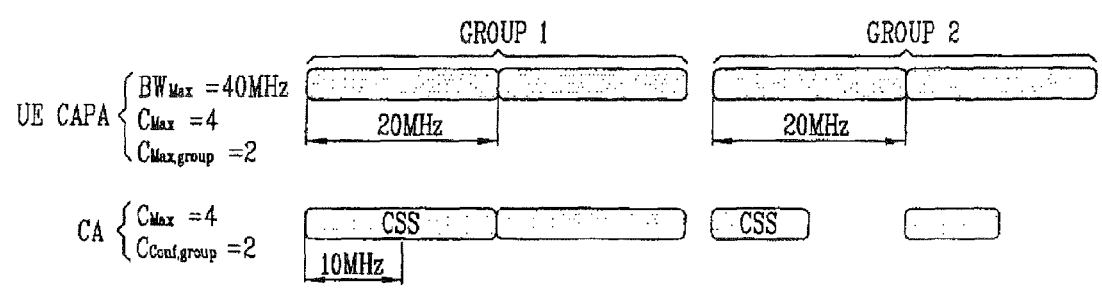
FIG. 18 is a diagram illustrating an example when Method 2 is applied according the first embodiment of the present disclosure.

FIG. 18 is a diagram illustrating an example when the Method 2 is applied according the first embodiment of the present disclosure.

That is, FIG. 18 illustrates a case where the maximum transmit/receive bandwidth of the UE is set in proportion to the maximum number of CCs which the UE can simultaneously receive, and CSS is allocated for each carrier group.

Referring to FIG. 18, it can be seen that the maximum bandwidth of the UE is 40 MHz, the maximum number of CCs which the UE can simultaneously receive is 4, two carrier groups are allocated to the UE, and the maximum number of CCs in each carrier group is set to 2.

Also, it can be seen that the maximum number of CCs to which the CSS is allocated in each carrier group is 1. Here, the CC to which the CSS is allocated may be a CC on which PUCCH is transmitted or a primary CC.

In the Method 2, the number of maximum BD times for each search space may be set according to the maximum number of CCs which the UE can simultaneously receive, but the number of maximum BD times for each search space may be set according to the number of CCs actually configured from the BS.

In this case, the number of maximum BD times in the UE according to the number of the actually configured CCs (the number of CCs which the UE actually receives from the BS or the number of activated CCs among the received CCs) may be expressed as follows.

1) The number of maximum blind decoding times in CSS:

$B_{CSS,Max,total,conf} = B_{CSS,Max,ref} * C_{Conf,group}$ (i.e., multiple of $C_{Conf,group}$)

2) The number of maximum blind decoding times in USS:

$B_{USS,Max,total,conf} = B_{USS,MaxUL/DL,ref} * C_{Conf} + B_{USS,MaxULMIMO,ref} * C_{Conf,ULMIMO}$ (i.e., multiple of $C_{Conf}$)

Here, the number of maximum BD times for the PDCCH transmitted through the CSS increases in proportion to the number of actually configured CC groups, and the number of maximum BD times for the PDCCH transmitted through the USS increases in proportion to the number of actually configured CCs.

Additionally, when considering the BD of a DCI format size for the UL MIMO, a value in proportion to the number of actually configured UL MIMO CCs is added to the number of maximum BD times.

Second Embodiment

The second embodiment provides a method of setting the maximum BD capability for each search space in consideration of the maximum transmission/reception amount of the UE (i.e., in a case where the maximum bandwidth of the UE does not increase).

That is, the second embodiment provides a method for solving a case where the load on detection capability of an unnecessary control signal is increased in the UE configured so that the maximum transmit/receive bandwidth of the UE does not increase, but the number of CCs which the UE can simultaneously receive increases.

Figure 19:
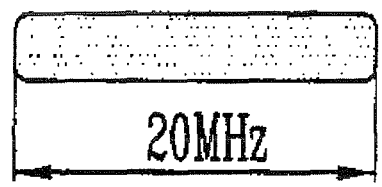
FIG. 19 is a diagram illustrating an example in which the maximum bandwidth of the UE as compared with the reference case does not increase, but only the maximum number of CCs which the UE can simultaneously transmit/receive according to the second embodiment of the present disclosure.
Figure 19:
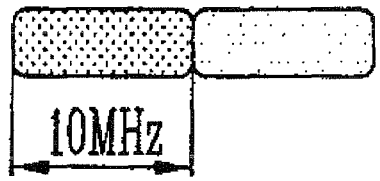

FIG. 19 is a diagram illustrating an example in which the maximum bandwidth of the UE as compared with the reference case does not increase, but only the maximum number of CCs which the UE can simultaneously transmit/receive according to the second embodiment of the present disclosure.

Referring to FIG. 19, it can be seen that as the capability of the UE, the maximum bandwidth of the UE is set to 20 MHz, and the maximum number of CCs which the UE can simultaneously transmit/receive is set to 2. In this case, the UE may use two CCs in a band of 10 MHz.

Hereinafter, a method of setting the number of maximum BD times for each search space according to the second embodiment will be described.

1. The number of maximum blind decoding times in CSS

Since the PDCCH transmitted to the CSS mainly contains control information common to all UEs, all the UEs must have the capability of detecting all available PDCCHs transmitted to the CSS.

Therefore, the number of maximum BD times in the CSS is set by the methods in the first embodiment without considering the maximum bandwidth according to the capability of the UE.

For example, in a case where the CSS is transmitted for each CC, all the UEs are set so that the maximum BD detection capability in the CSS is in proportion to an increase in the number of CCs.

Meanwhile, it may be considered that only the CSS with respect to a specific CC (e.g., PCC) exists.

2. The number of maximum blind decoding times in USS

Since the PDCCH transmitted to the USS contains scheduling information on a specific UE, the number of resources that can perform scheduling on the corresponding UE is decreased when the bandwidth of the UE that transmits/receives CCs is narrow. Therefore, the frequency of a control signal for scheduling is also decreased, and the maximum BD detection capability may be reduced.

That is, the second embodiment provides a method of setting the number of maximum BD times for detecting common PDCCH transmitted to the CSS so as to be in proportion to the maximum number of CCs which the UE can simultaneously receive or to be in proportion to the number of carrier groups, and setting the number of maximum BD times for detecting UE-specific PDCCH transmitted to the USS so as to be in proportion to the maximum bandwidth in which the corresponding UE can simultaneously receive CCs.

As an example of the second embodiment, the number of maximum BD times in each search space as compared with that in the reference case may be expressed as follows.

1) The number of maximum blind decoding times in CSS:

$$B_{CSS,Max,total} = B_{CSS,Max,ref} * C_{Max} \text{ (i.e., multiple of } C_{Max})$$

However, in a case where only the CSS with respect to a specific CC (e.g., PCC) exists, the number of BDs in the CCS is $B_{CSS,Max,total} = B_{CSS,Max,total,conf} = B_{CSS,Max,ref}$.

2) The number of maximum blind decoding times in USS:

$$B_{USS,Max,total} = B_{USS,Max,ref} * \text{ceiling}(BW_{Max}/BW_{ref})$$
(i.e., multiple of ratio of $BW_{Max}/BW_{ref}$)

Here, the ceiling(A) is a function of outputting an integer closest to A, which is greater than or identical to A. In a case where the $BW_{Max}$ is not a multiple of the $BW_{ref}$, the ceiling (A) is a function for setting the $BW_{Max}$ to become an integer.

Hereinafter, a method of allocating, for each CC, the number of maximum BD times for each search space (CSS or USS) of the UE, described in the first and second embodiments.

Method of Allocating Number of Maximum BD Times for Each CC

1. Method of allocating number of maximum BD times for each CC in CSS

In each method of allocating the number of maximum BD times with respect to the common PDCCH in the CSS, the number of maximum BD times for each CC on which the CSS is transmitted is fixed to be the same as that in the reference case.

For example, in a case where the number of the maximum BD times in the CSS is determined in proportion to the maximum number of CCs which the UE can simultaneously transmit/receive, the number of maximum BD times for each CC on which the CSS is transmitted is allocated to be the same as that in the reference case.

The reason why the number of maximum BD times in the CSS is allocated to be the same as that for each CC in the reference case is that cross-scheduling is not allowed in the CSS even when one or more specific CCs that become PDCCH monitoring CCs perform the cross-scheduling on neighboring CCs. Therefore, the number of the maximum BD times, distributed to the PDCCH monitoring CCs, is the same as that in the reference case.

That is, the number of maximum BD times in the CSS is allocated for each CC so as to be the same as that in the reference case.

2. Method of allocating number of maximum BD times for each CC in USS

Unlike the method of allocating the number of maximum BD times for each CC in the CSS, in the UE-specific PDCCH transmitted to the USS, the number of maximum BD times is set depending on the maximum bandwidth in which the UE can transmit/receive CCs. Therefore, by considering this, various methods of allocating the number of maximum BD times for each CC will be described.

Here, the distribution (or allocation) of the number of maximum BD times for each CC means distribution for each CC on which PDSCH is transmitted (hereinafter, referred to as 'PDSCH CC' for convenience of illustration).

That is, in a case where the cross-scheduling is not performed, one PDSCH CC is scheduled in only the PDCCH region belonging to a corresponding CC, and therefore, the number of maximum BD times allocated to the one PDSCH CC is allocated to the number of maximum BD times with respect to the PDCCH transmitted to the corresponding PDCCH region.

On the other hand, in a case where the cross-scheduling is performed, one or more PDSCH CCs are scheduled through the PDCCH region of PDCCH monitoring CC, and therefore, the sum of the numbers of maximum BD times respectively allocated to the configured PDSCH CCs is allocated to the number of maximum BD times with respect to the PDCCH transmitted to the PDCCH region of the PDCCH monitoring CC.

That is, in a case where the number of CCs scheduled by one PDCCH monitoring CC is set to 3, the available BD detection value is allocated to each of the three CCs according to the distribution method for each CC, which will be described below, and the sum of the maximum available BD values respectively allocated to the three CCs is allocated to the PDCCH monitoring CC.

(1) Method 1

The Method 1 is a method of setting the number of maximum BD times, allocated for each CC, not to exceed that in the reference case, and setting the sum of the numbers of maximum BD times, respectively allocated to the CCs, not to exceed the total number of maximum BD times in the USS of the UE.

In the Method 1, information on the number of maximum BD times, allocated for each CC, may be transmitted to the UE from a system (e.g., a BS).

In the Method 1, the number of maximum BD times, allocated for each CC, is set not to exceed that for each CC in the reference case.

Since the maximum transmit/receive bandwidth of each CC is set not to be greater than that $BW_{ref}$ in the reference case, unnecessary waste of resources may be caused when the number of maximum BD times for each CCs is set to exceed the number of maximum BD times $B_{USS,Max,ref}$ in the reference case. The total sum of the numbers of maximum BD times, respectively set (or allocated) to CCs, must not exceed the number of maximum BD times, set in the UE.

The information on the number of maximum BD times for each CC is transmitted to the UE from the BS.

Here, the BS may transmit the information on the number of maximum BD times for each CC to only a UE satisfying that the value obtained by dividing the maximum bandwidth in the reference case into the maximum bandwidth of the UE is greater than the maximum number of CC which the UE can simultaneously transmit/receive ($BW_{Max}/BW_{ref} < C_{Max}$).

That is, the Method 1 is summarized as follows.
The setting of the number of maximum BD times based on the maximum bandwidth of the UE:

$$B_{USS,Max,CCi}=\text{Configurable} \leq B_{USS,Max,ref}$$

The BS sets the number of maximum BD times for each CC so that the total number of BD times does not exceed the number of maximum BD times in the UE and each CC BD does not exceed the number of maximum BD times in the reference case, and informs the UE of the number of maximum BD times for each CC through RRC signaling.

(2) Method 2

The Method 2 is a method of distributing the number of maximum BD times for each CC in proportion to the bandwidth of each CC, and setting a lower limit of the number of maximum BD times, allocated for each CC.

According to the Method 2, the number of maximum BD times for each CC is set in proportion to the bandwidth of the corresponding CC with respect to that in the reference case ($BW_{CCi}/BW_{ref}$). The lower limit $B_{USS/CC,Min}$ of the allocated BE times is set, so that although the bandwidth is set to be very small, the number of BD times, which is set to the lower limit, is allocated.

In this case, a value obtained by dividing the maximum number of CCs that the UE can simultaneously receive into the number of maximum BD times in the USS of the UE may be used as the lower limit of BD times for each CC.

That is, the setting of the number of BD times for each CC according to the Method 2 may be summarized as follows.
The setting of the number of maximum BD times based on the maximum bandwidth of the UE (USS)

$$B_{USS,Max,CCi}=\text{Max}(B_{USS,Max,ref}/\text{ceiling}(BW_{ref}/BW_{CCi}),B_{USS/CC,Min}) \quad 1) \text{ or}$$

$$B_{USS,Max,CCi}=\text{Max}(B_{USS,Max,ref}*\text{floor}(BW_{CCi}/BW_{ref}),B_{USS/CC,Min}) \quad 2)$$

Here, the $B_{USS,Max,ref}/\text{ceiling}(BW_{ref}/BW_{CCi})$ is decreased according to the ratio of the CC to that (20 MHz) in the reference case, and the $B_{USS/CC,Min}$ determines the lower limit of the number of maximum BD times.

The floor(A) is a function of outputting an integer closest to A, which is smaller than or identical to A. In a case where the $BW_{CCi}$ is not a multiple of the $BW_{ref}$, the floor(A) is a function for setting the $BW_{CCi}$ to become an integer.

Figure 20:
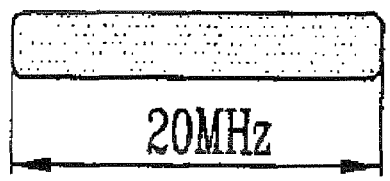
FIG. 20 is a diagram illustrating an example in which the Method 2 is applied in the method of allocating the number of BD times for each CC according to an embodiment of the present disclosure.
Figure 20:

FIG. 20 is a diagram illustrating an example in which the Method 2 is applied in the method of allocating the number of BD times for each CC according to an embodiment of the present disclosure.

Referring to FIG. 20, the capability of the UE is set so that the maximum bandwidth in which the UE can simultaneously transmit/receive CCs is 20 MHz, the number of maximum BD times is 48, and the UE can transmit/receive a maximum of two CCs. The UE is set to transmit/receive two actually configured CCs in a band of 10 MHz. In this case, the frequency bands of the two actually configured CCs are identical to each other, and hence the number of maximum BD times is distributed to the CCs so that the number of BD times for each CC becomes 24.

Figure 21:
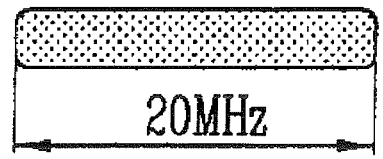
FIG. 21 is a diagram illustrating an example in which the lower limit of the number of BD times for each CC is set when the Method 2 is applied in the method of allocating the number of BD times for each CC according to an embodiment of the present disclosure.
Figure 21:
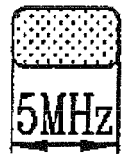

FIG. 21 is a diagram illustrating an example in which the lower limit of the number of BD times for each CC is set when the Method 2 is applied in the method of allocating the number of BD times for each CC according to an embodiment of the present disclosure.

Referring to FIG. 21, the UE is set so that the maximum bandwidth in which the UE can simultaneously transmit/receive CCs is 20 MHz, the number of maximum BD times is 48, and the UE can transmit/receive a maximum of two CCs.

When the UE receives one band of 5 MHz, and the number of maximum BD times in the USS is divided to be simply suitable for the width of the one band of CCs, the usage of BD (only 12 BD times are allocated) may be restricted as compared with the capability of the UE (the number of maximum BD times: 48). Therefore, the lower limit or more is necessarily allocated to each CC by setting the lower limit of the number of maximum BD times (24 BD times) for each CC. That is, this may be summarized as follows.

$$B_{USS,Max,total}=B_{USS,Max,ref}*\text{ceiling}(BW_{max}/BW_{ref})=48 \quad 1)$$

$$B_{USS,Max,ref}/\text{ceiling}(BW_{ref}/BW_{CCi})=12, B_{USS/CC,Min}=24 \quad 2)$$

The lower limit set in the Method 2 is varied in inverse proportion to the number of CC actually allocated to the UE, and may be set not to exceed the number of maximum BD times in the reference case.

Figure 22:
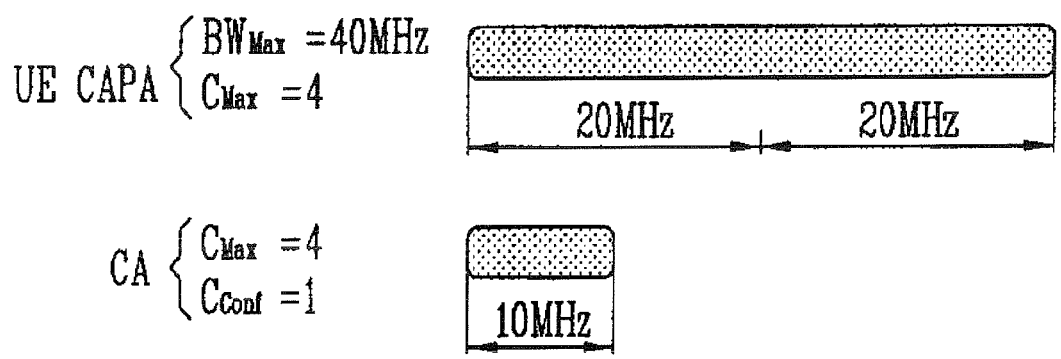
FIG. 22 is a diagram illustrating an example in which the lower limit of the number of BD times for each CC is set and the set lower limit is set based on the number of actually allocated CCs when the Method 2 is applied in the method of allocating the number of BD times for each CC according to an embodiment of the present disclosure.

FIG. 22 is a diagram illustrating an example in which the lower limit of the number of BD times for each CC is set and the set lower limit is set based on the number of actually allocated CCs when the Method 2 is applied in the method of allocating the number of BD times for each CC according to an embodiment of the present disclosure.

Referring to FIG. 22, in a case where the maximum bandwidth in which the UE can simultaneously transmit/receive CCs is 40 MHz, the UE is set so that the number of maximum BD times is 98, and the UE can transmit/receive a maximum of two CCs. In this case, when the UE actually receives CCs in one band of 10 MHz, the number of maximum BD times, allocated for each CC, becomes 24.

In a case where the number of maximum BD times is allocated to be simply suitable for the width of the band of CCs as described in the Method 2, the usage of BD (only 24 BD times are allocated) may be restricted as compared with the capability of the UE (the number of maximum BD times: 96).

Thus, as shown in FIG. 22, the lower limit of the number of maximum BD times is set so that the lower limit of the number of maximum BD times for each CC is in inverse proportion to the number of CCs actually allocated to the UE. However, in a case where the lower limit is set in inverse proportion to the number of CCs actually allocated to the UE, the upper limit of the number of maximum BD times for each CC is set to prevent the lower limit is set in inverse proportion to the number of CCs from being unnecessarily increased.

The lower and upper limits of the number of maximum BD times for each CC shown in FIG. 22 may be summarized as follows.

The setting of the number of maximum BD times based on the maximum bandwidth of the UE (USS)

$$B_{USS,Max,total}=B_{USS,Max,ref}*(BW_{max}/BW_{ref})=96 \quad 1)$$

$$B_{USS,Max,ref}/\text{ceiling}(BW_{ref}/BW_{CCi})=24 \quad 2)$$

$$B_{USS/CC,Min}=\min(B_{USS,Max,total}/C_{conf}, B_{USS,Max,ref})=\min(96,48)=48 \quad 3)$$

That is, the lower limit based on the number of CCs actually allocated to the UE may be set as follows.
The setting of the number of maximum BD times based on the maximum bandwidth of the UE (USS)

$$B_{USS,Max,CCi}=\text{Max}(B_{USS,Max,ref}/\text{ceiling}(BW_{ref}/BW_{CCi}), \text{Min}(B_{USS,Max,total}/C_{Conf}, B_{USS,Max,ref})), \quad 1) \text{ or}$$

$$B_{USS,Max,CCi}=\text{Max}(B_{USS,Max,ref}*\text{floor}(BW_{CCi}/BW_{ref}), \text{Min}(B_{USS,Max,total}/C_{Conf}, B_{USS,Max,ref})), \quad 2) \text{ or}$$

$$B_{USS,Max,CCi} = \text{Min}(\text{Max}(B_{USS,Max,ref}/\text{ceiling}(BW_{ref}/BW_{CCi}), B_{USS,Max,total}/C_{Conf}, B_{USS,Max,ref})), \quad 3) \text{ or}$$

$$B_{USS,Max,CCi} = \text{Min}(\text{Max}(B_{USS,Max,ref}/\text{floor}(BW_{CCi}/BW_{ref}), B_{USS,Max,total}/C_{Conf}, B_{USS,Max,ref})) \quad 4)$$

Here, the $B_{USS,Max,ref}/\text{ceiling}(BW_{ref}/BW_{CCi})$ decreases according to the ratio of the bandwidth of CC to that (20 MHz) in the reference case, and the $\text{Min}(B_{USS,Max,total}/C_{Conf}, B_{USS,Max,ref})$ is changed depending on the $C_{Conf}$ set in the UE. The number of maximum BD times does not exceed that in the reference case.

(3) Method 3

The Method 3 is a method of setting the number of maximum BD times for each CC by dividing the number of CCs which the UE can transmit/receive or the number of CCs actually allocated to the UE into the number of maximum BD times for each CC.

In the Method 3, the number of maximum BD times in the USS of the UE is simply distributed for each CC by dividing the number of CCs which the UE can transmit/receive or the number of CCs actually allocated to the UE into the number of maximum BD times for each CC.

In a case where the number of BD times, allocated for each CC, is divided by the number of CCs actually allocated to the UE, it is possible to prevent the capability of allocating the number of BD times to the corresponding CC from being reduced as compared with that of the actual UE that receives a small number of CCs.

In the Method 3, the number of BD times, allocated to each CC, may be set not to exceed the number of maximum BD times in the reference case.

In a case where the number of maximum BD times can be set according to the number of CCs actually configured from the BS, the number of maximum BD times in the UE according to the number of actually configured CCs (the number of CCs which the UE actually receives from the BS or the number of activated CCs among the received CCs) may be expressed as follows.

The number of maximum BD times in USS:

$$B_{CSS,Max,total,conf} = \sum_{i} B_{USS,Max,CCi}$$

(here, the i is an index of actually configured CC)

The scope of the present disclosure is not limited to the embodiments disclosed in this specification, and it will be understood by those skilled in the art that various changes and modifications can be made thereto within the technical spirit and scope defined by the appended claims.

The invention claimed is:

1. A method for monitoring a control channel in a wireless access system, the method comprising:
setting a number of maximum blind decoding times for each user equipment (UE)-specific search space and a common search space to which the control channel is transmitted;
monitoring a plurality of candidate control channels in each of the search spaces, based on the number of maximum blind decoding times, set in the respective search spaces; and
receiving downlink control information through a control channel which has succeeded in the blinding decoding among the plurality of candidate control channels,
wherein the common search space is allocated to one component carrier among a plurality of component carriers included in a carrier group, and
wherein a number of maximum blind decoding times in the common search space is determined based on a maximum number of carrier groups simultaneously received by the UE.

2. The method of claim 1, wherein the monitoring includes performing blind decoding on the plurality of candidate control channels, and the performing of the blind decoding includes performing cyclic redundancy check (CRC) masking on each candidate control channel using a radio network temporary identifier (RNTI).

3. The method of claim 1, wherein component carrier having the common search space allocated thereto is a primary component carrier or component earner on which a physical uplink control channel (PUCCH) is transmitted.

4. The method of claim 1, wherein at least one carrier group includes at least one component carrier having component carriers with the same frequency band, component carriers with different frequency bands, or a heterogeneous duplex structure or heterogeneous downlink-uplink (DL-UL) configuration.

5. The method of claim 1, wherein the number of maximum blind decoding times in the UE-specific search space is set based on the maximum bandwidth in which a UE simultaneously transmits/receives component carriers according to the capability of the UE.

6. The method of claim 5, wherein the number of maximum blind decoding times in the UE-specific search space is set based on the maximum number of component carriers which the UE transmits/receives according to the capability of the UE, the number of component carriers which the UE receives from a base station, or the number of activated component carriers among the received component carriers.

7. The method of claim 6, wherein the number of maximum blind decoding times in the UE-specific search space is allocated for each component carrier, and the number of blind decoding times, allocated for each component carrier, is determined based on the bandwidth of each component carrier transmitted to the base station or the number of component carriers which the UE receives from the base station.

8. The method of claim 7, Wherein, when the number of maximum blind decoding times in the UE-specific search space is allocated for each component carrier based on the bandwidth of each component carrier, a lower limit of the number of blind decoding times for each component carrier is determined.

9. The method of claim 8, wherein the lower limit is a value obtained by dividing the maximum number of component carriers which the UE transmits/receives according to the capability of the UE, the number of component carriers which the UE receives from a base station, or the number of activated component carriers among the received component carriers into the number of maximum blind decoding times in the UE-specific search space.

10. The method of claim 8, wherein the lower limit does not exceed the number of maximum blind decoding times in the reference case.

11. The method of claim 7, Wherein the number of maximum blind decoding times for each component carrier is determined, and the number of maximum blind decoding times is set to that in a reference case.

12. The method of claim 11, wherein the reference case is set so that the maximum transmit/receive bandwidth of the UE is 20 MHz, a single carrier is supported, and the number of maximum blind decoding times in the UE-specific search space is 48.

13. The method of claim 1, wherein the control channel is a physical downlink control channel (PDCCH).

14. A UE for monitoring a control channel in a wireless access system, the UE comprising:
a radio frequency (RF) unit configured to receive a downlink signal from a base station; and
a control unit connected to the RF unit and configured to:
set a number of maximum blind decoding times for each UE-specific search space and a common search space to which the control channel is transmitted,
monitor a plurality of candidate control channels in each of the search spaces, based on the number of maximum blind decoding times, set in the respective search spaces, and
receive downlink control information through a control channel which has succeeded in the blinding decoding among the plurality of candidate control channels,
wherein the common search space is allocated to one component carrier among plurality of component carriers included in a carrier group, and
wherein a number of maximum blind decoding times in the common search space is determined based on a maximum number of carrier groups simultaneously received by the UE.

15. The UE of claim 14, wherein a component carrier having the common search space allocated thereto is a primary component carrier or component carrier on which a PUCCH is transmitted.

16. The UE of claim 14, wherein the number of maximum blind decoding times in the UE-specific search space is set based on the maximum bandwidth in which the UE simultaneously transmits/receives component carriers according to the capability of the UE.

17. The UE of claim 16, wherein the control unit controls the UE so that the number of maximum blind decoding times in the UE-specific search space is set based on the maximum number of component carriers which the UE transmits/receives according to the capability of the UE, the number of component carriers which the UE receives from a base station, or the number of activated component carriers among the received component carriers.

18. The UE of claim 14, wherein the control unit controls the UE so that the number of maximum blind decoding times in the UE-specific search space is allocated for each component carrier, and the number of blind decoding times, allocated for each component carrier, is determined based on the bandwidth of each component carrier transmitted to the base station or the number of component carriers Which the UE receives from the base station.

* * * * *